US012707663B2

(12) United States Patent
Kuroda et al.

(10) Patent No.: US 12,707,663 B2
(45) Date of Patent: Aug. 11, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Ryota Kuroda, Tokyo (JP); Hitoshi Matsuura, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 394 days.

(21) Appl. No.: 18/452,811

(22) Filed: Aug. 21, 2023

(65) Prior Publication Data

US 2024/0162335 A1 May 16, 2024

(30) Foreign Application Priority Data

Nov. 10, 2022 (JP) ................................ 2022-180096

(51) Int. Cl.

*H10D 12/01* (2025.01)
*H10D 12/00* (2025.01)
*H10D 62/10* (2025.01)
*H10D 62/17* (2025.01)
*H10D 64/00* (2025.01)

(52) U.S. Cl.

CPC ......... *H10D 12/481* (2025.01); *H10D 12/038* (2025.01); *H10D 62/127* (2025.01); *H10D 62/393* (2025.01); *H10D 64/117* (2025.01)

(58) Field of Classification Search

CPC .. H10D 12/481; H10D 12/038; H10D 62/127; H10D 64/117; H10D 62/142; H10D 62/393

See application file for complete search history.

(56) References Cited

U.S. PATENT DOCUMENTS 7,834,407 B2 11/2010 Nakazawa et al.
2007/0210350 A1* 9/2007 Omura ................ H10D 12/481 257/E21.384
2016/0365294 A1* 12/2016 Mori ....................... H01L 22/30
2017/0229448 A1* 8/2017 Tanaka .................. H01L 23/585
2021/0257355 A1* 8/2021 Zhu ...................... H10D 84/811
2024/0014298 A1* 1/2024 Miyashita ............ H10D 62/128
2024/0072043 A1* 2/2024 Fujii .................... H10D 12/481

FOREIGN PATENT DOCUMENTS

JP 2006-324570 A 11/2006

* cited by examiner

*Primary Examiner* — David Vu
*Assistant Examiner* — Brandon C Fox
(74) *Attorney, Agent, or Firm* — Rimon P.C.

(57) ABSTRACT

A semiconductor device includes a trench formed in an element formation region of a semiconductor substrate, an insulating film formed on an inner wall of the trench, a p-type semiconductor portion embedded in a part of the trench via the insulating film, and an n-type semiconductor portion embedded in another part of the trench via the insulating film and provided so as to contact with the p-type semiconductor portion.

13 Claims, 23 Drawing Sheets

20a(20)
KE
IL
PLG1
PLG2
NSU1
(NSU)
PB
PSU
TR
TO
PWL
SUB
RN
RP
AE

FIG. 16A
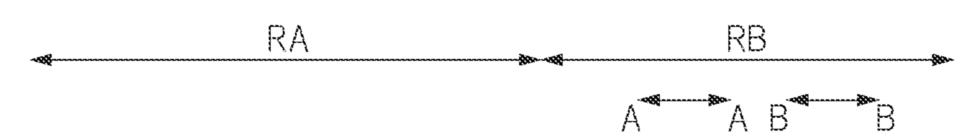
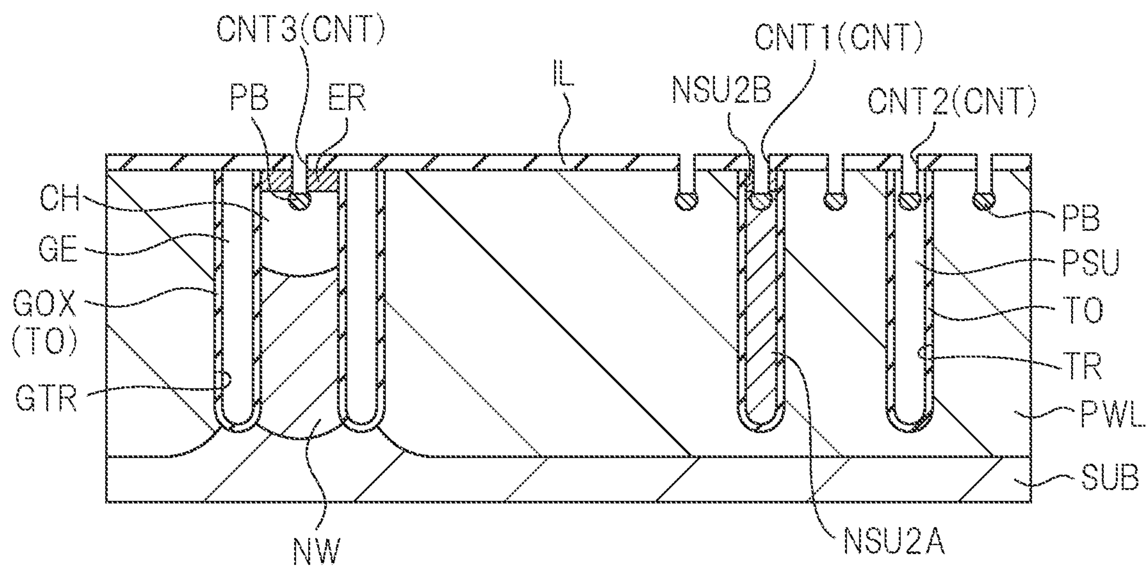
FIG. 16B
C
C
CNT2(CNT)
IL
CNT1(CNT)
NSU2B
PB
PB
TO
PSU
TR
PWL
SUB
NSU2A FIG. 17A
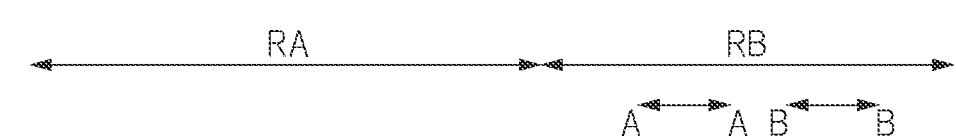
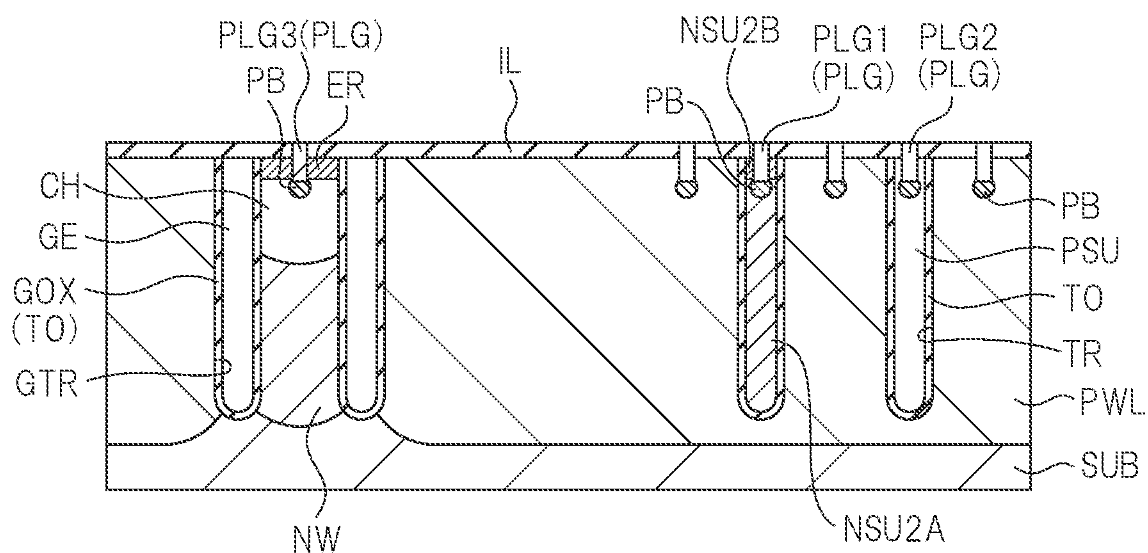
FIG. 17B
C
C
PLG2(PLG)
IL
PLG1(PLG)
NSU2B
PB
PB
TO
PSU
TR
PWL
SUB
NSU2A 30b(30)
ME2
NSU2Bb(NSU)
PB
PWL
TR
NSU2Ab(NSU)
TO
SUB
RN
RP
PLG1Ba
PSU3D (PSU)
PSU3C (PSU)
PSU3B (PSU)
IL
PSU3A (PSU)
PLG1Aa
ME1
NSU2Ba(NSU)
PB
NSU2Aa(NSU)
NSU3C (NSU)
NSU3B (NSU)
NSU3A (NSU)

SEMICONDUCTOR DEVICE AND METHOD OF MANUFACTURING THE SAME

CROSS-REFERENCE TO RELATED APPLICATIONS

The present application claims priority from Japanese Patent Application No. 2022-180096 filed on Nov. 10, 2022, the content of which is hereby incorporated by reference to this application.

BACKGROUND

The present invention relates to a semiconductor device and its manufacturing technique, for example, relates to a technique effectively applied to a semiconductor device including an optional element typified by a temperature detection diode and a gate protection diode in addition to a power transistor, and its manufacturing technique.

There is a disclosed technique listed below.

[Patent Document 1] Japanese Unexamined Patent Application Publication No. 2006-324570

Patent Document 1 discloses a technique relating to a trench gate type power transistor.

SUMMARY

For example, there are semiconductor devices that include power transistors as well as the optional element typified by temperature detection diodes and gate protection diodes. Such semiconductor devices are manufactured by using, for example, 200 mm semiconductor wafers.

Here, in a manufacturing process of a semiconductor device using the 200 mm semiconductor wafer, the above-mentioned optional element is formed by using a polysilicon film formed on a semiconductor substrate. Therefore, a step is generated on a surface of the semiconductor substrate. As a result, formation of contact plugs becomes more difficult due to difficulties such as focusing in a photolithography technique used in a subsequent process of forming the contact plugs.

Also, in recent years, manufacture of semiconductor devices using 300 mm semiconductor wafers, which have a larger diameter than the 200 mm semiconductor wafers, has been considered.

In the manufacturing process of the semiconductor devices using this 300 mm semiconductor wafer, improving manufacturing lines advances by overcoming disadvantages that are present in the manufacturing process of the above-mentioned 200 mm semiconductor wafer. In particular, in the manufacturing process of the semiconductor devices using 300 mm semiconductor wafers, it is desired to enhance flatness of the semiconductor devices including power transistors and the optional element in order to avoid complication and increased difficulty in the manufacturing process due to a step on the surface of the semiconductor substrate.

From the above, in order to enhancing the flatness of semiconductor devices including power transistors and the optional element, it is desired to devise structures of the optional element.

According to one example, a semiconductor device includes: a trench formed in an element formation region of a semiconductor substrate; an insulating film formed on an inner wall of the trench; a p-type semiconductor portion embedded in a part of the trench via the insulating film; and an n-type semiconductor portion embedded in another part of the trench via the insulating film and provided so as to contact with the p-type semiconductor portion.

According to one example, a manufacturing method of semiconductor device includes: (a) forming a gate trench in a first region of a semiconductor substrate, and forming a trench in a second region of the semiconductor substrate; (b) forming a gate insulating film on an inner wall of the gate trench, and forming an insulating film on an inner wall of the trench; (c) forming a gate electrode in the gate trench; (d) forming a p-type semiconductor portion in the trench; and (e) forming an n-type semiconductor portion contacting with the p-type semiconductor portion in the trench.

According to one embodiment, the flatness of the semiconductor devices including power transistors and the optional element can be enhanced.

BRIEF DESCRIPTION OF THE DRAWINGS

FIGS. 16A and 16B are diagrams each showing a manufacturing process following FIG. 15.

FIGS. 17A and 17B are diagrams each showing a manufacturing process following FIG. 16.

DETAILED DESCRIPTION

In all the drawings for explaining the embodiments, the same components are denoted by the same reference number in principle, and a repetitive description thereof will be omitted. The hatching may be used even in a plan view in order to make the drawings easy to see.

In the present embodiment, an IGBT (Insulated Gate Bipolar Transistor) will be described as an example of a power transistor, but the technical idea of the present embodiment is not limited to the IGBT and, for example, can also be widely applied to a power MOSFET (Metal Oxide Semiconductor Field Effect Transistor).

Circuit Configuration of IGBT Chip

In the present specification, a semiconductor chip in which the IGBT serving as a semiconductor device is formed is called an IGBT chip, and a circuit configuration of the IGBT chip will be shown below.

Figure 1:
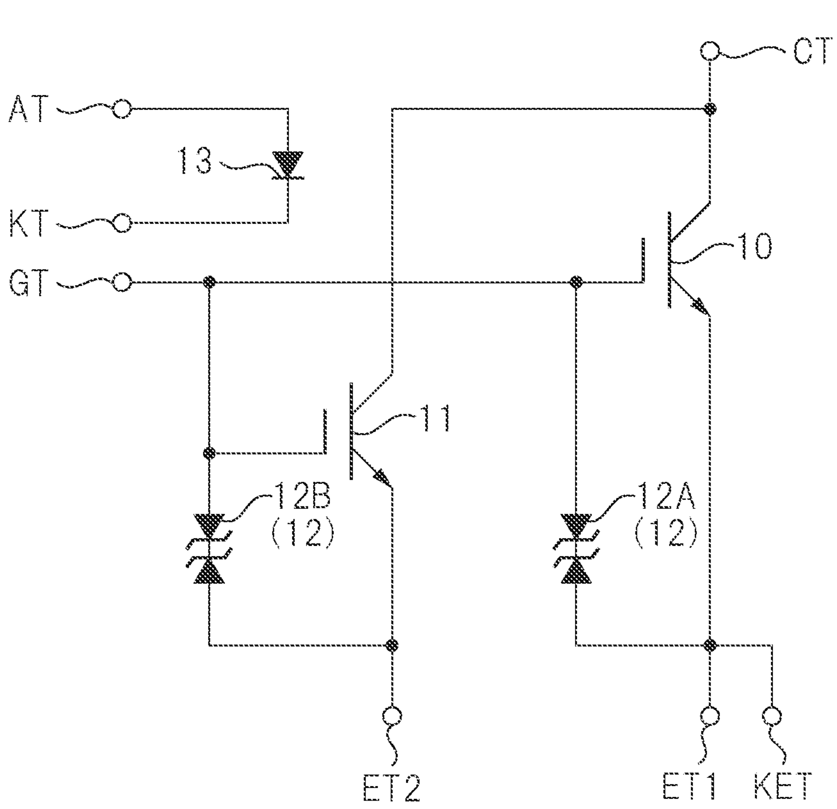
FIG. 1 is a circuit diagram showing a circuit configuration of an IGBT chip.

FIG. 1 is a circuit diagram showing a circuit configuration of an IGBT chip.

In FIG. 1, an IGBT chip is provided with a main IGBT 10 for flowing through a main current and a sub-IGBT 11 (sense IGBT) for detecting a current value of the main current. Particularly, the main IGBT 10 is provided between a collector terminal CT and an emitter terminal ET1, and the sub-IGBT 11 is provided between the collector terminal CT and a sub-emitter terminal ET2. In this case, a gate electrode of the main IGBT 10 and a gate electrode of the sub-IGBT 11 are electrically connected to each other, and both of these gate electrodes are connected to a gate terminal GT. For example, if a current flowing through the main IGBT 10 is called a main current and a current flowing through the sub-IGBT 11 is called a sense current, main current:sense current (sense ratio)=10000:1. Incidentally, the main IGBT 10 is electrically connected not only to the emitter terminal ET1 but also to a Kelvin emitter terminal KET.

In addition, on the IGBT chip, a gate protection diode 12A is provided. When a surge voltage is applied to the gate electrode of the main IGBT 10, the gate protection diode 12A protects the main IGBT 10 from this surge voltage. Similarly, on the IGBT chip, a gate protection diode 12B is provided. When the surge voltage is applied to the gate electrode of the sub-IGBT 11, the gate protection diode 12B protects the sub-IGBT 11 from this surge voltage.

Particularly, the gate protection diode 12A is provided between the gate terminal GT and the emitter terminal ET1, while the gate protection diode 12B is provided between the gate terminal GT and the sub-emitter terminal ET2. Each of these gate protection diodes 12A and 12B is configured of, for example, a plurality of Zener diodes connected in reverse series (bidirectionally connected).

The gate protection diode 12A and the gate protection diode 12B have characteristics in which a voltage higher than a reverse breakdown voltage is not applied. Therefore, even if the large surge voltage is applied between the gate terminal GT and the emitter terminal ET1 or between the gate terminal GT and the sub-emitter terminal ET2, the surge voltage is clamped to the reverse breakdown voltage by the gate protection diode 12A or the gate protection diode 12B. As a result, it is possible to suppress the application of a voltage higher than the reverse breakdown voltage to the main IGBT 10 or the sub-IGBT 11.

Thus, the gate protection diode 12A is provided between the gate terminal GT and the emitter terminal ET1, which are input terminals for inputting control signals, and the gate protection diode 12B is provided between the gate terminal GT and the sub-emitter terminal ET2, which makes it possible to prevent the breakdown of the main IGBT 10 and the sub-IGBT 11 caused by the surge voltage.

Furthermore, the IGBT chip is provided with a temperature detection diode 13. This temperature detection diode 13 is provided between an anode terminal AT and a cathode terminal KT, and has a function of measuring a temperature of the IGBT chip. Particularly, a forward voltage drop (VF) of the temperature detection diode 13 has temperature dependent. Therefore, for example, the temperature can be indirectly detected by measuring the forward voltage drop (VF) when a constant current is passed through the temperature detection diode 13.

A circuit of the IGBT chip is configured as described above.

Layout Configuration of IGBT Chip

Next, a layout configuration of the IGBT chip will be explained.

Figure 2:
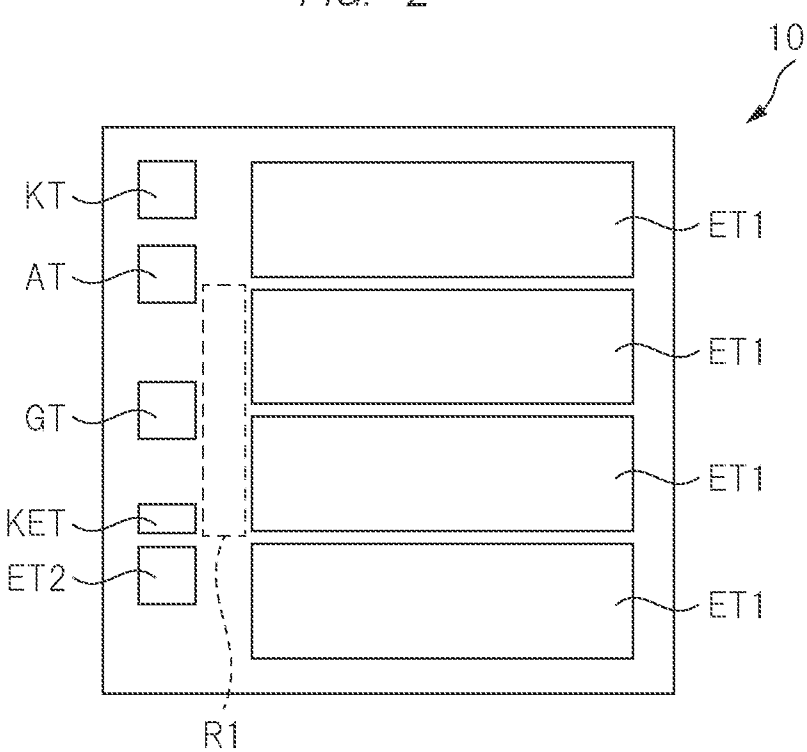
FIG. 2 is a top view showing a planar layout of the IGBT chip.

FIG. 2 is a top view showing a planar layout of the IGBT chip 100.

In FIG. 2, the emitter terminal ET1 divided into, for example, four, the cathode terminal KT, the anode terminal AT, the gate terminal GT, the Kelvin emitter terminal KET, and the sub-emitter terminal ET2 are formed on an upper surface of the IGBT chip 100.

Incidentally, a region R1 indicated by a dotted line in FIG. 2 is a gate protection diode mounting region. Further, the collector terminal is formed on the entire lower surface (entire back surface) of the IGBT chip 100.

A layout of the IGBT chip 100 is configured as described above.

Consideration of Improvement

As shown in FIG. 1, the IGBT chip is provided with the main IGBT 10 and the sub-IGBT 11, as well as the gate protection diode 12 and the temperature detection diode 13. Here, for example, the main IGBT 10 and sub-IGBT 11 are configured of a plurality of cells, and each of the plurality of cells is configured of a trench gate type IGBT.

Meanwhile, the gate protection diode 12 and the temperature detection diode 13 configure an optional element, and although not shown in FIG. 1, a gate resistor element electrically connected to a gate electrode of the trench gate type IGBT is also included in optional terminals. That is, the IGBT chip is provided with the optional element along with the trench gate type IGBT.

In the IGBT chip configured in this way, it is desired to enhance flatness of the semiconductor device including the trench gate type IGBT and the optional element in order to avoid complication and increased difficulty of a manufacturing process due to the step on the surface of the semiconductor substrate.

In this regard, first, the gate resistor element included in the optional element is devised. Particularly, a polysilicon film different from the polysilicon film used for the gate electrode of the trench gate type IGBT is formed on the semiconductor substrate and processed, thereby forming the gate resistor element electrically connected to the gate electrode of the trench gate type IGBT. That is, the gate electrode of the trench gate type IGBT is formed in the trench provided in the semiconductor substrate, while the gate resistor element is formed on the semiconductor substrate. As a result, the step occurs between the trench gate type IGBT and the gate resistor element.

Therefore, in recent years, the gate resistor element included in the optional element is devised to enhance the flatness of the semiconductor device including the trench gate type IGBT and the gate resistor element. Particularly, it is considered to form the gate resistor element from a structure in which the trench is formed in the semiconductor substrate and a polysilicon film is embedded in the trench via an insulating film. In other words, it is considered to form both the gate electrode of the trench gate type IGBT and the gate resistor element in the trench provided in the semiconductor substrate. According to this structure, it is not necessary to form the gate resistor element by the polysilicon film formed on the semiconductor substrate. Therefore, the flatness of the semiconductor device including the trench gate type IGBT and the gate resistor element can be enhanced.

However, as described above, the optional element provided in the IGBT chip includes the gate protection diode 12 and the temperature detection diode 13 in addition to the gate resistor element. Therefore, in order to enhance the flatness of the semiconductor device including the trench gate type IGBT and the optional element, devising only the gate resistor element is not sufficient, so that devising the gate protection diode 12 and the temperature detection diode 13 is also necessary.

Therefore, in the present embodiment, by devising the gate protection diode 12 and the temperature detection diode 13, the flatness of the semiconductor device including the trench gate type IGBT and the optional element are enhanced. In the following, the technical idea of the present embodiment devised as mentioned above will be described.

Basic Idea of Embodiment

A basic idea of the present embodiment is an idea of forming the trench in the semiconductor substrate to provide a p-type semiconductor portion and an n-type semiconductor portion in the trench via the insulating film. According to this basic idea, a pn junction diode is formed in the trench since a pn junction is formed at a contact surface between the p-type semiconductor portion and the n-type semiconductor portion in the trench. As a result, this pn junction diode can be used as the gate protection diode or the temperature detection diode. That is, according to the basic idea, the gate protection diode and the temperature detection diode can be formed in the trench.

This means that it is no longer necessary to form the gate protection diode and the temperature detection diode by using the polysilicon film that causes the step formed on the semiconductor substrate. That is, if the basic idea is adopted, all the optional element can be formed in the trench along with the trench gate type IGBT.

According to the basic idea, since the occurrence of the step between the trench gate type IGBT and the optional element can be suppressed, the flatness of the semiconductor device including the trench gate type IGBT and the optional element can be enhanced.

In other words, the semiconductor device adopting the basic concept includes: the trench formed in an element formation region of the semiconductor substrate; an insulating film formed on an inner wall of the trench; the p-type semiconductor portion embedded in a part of the trench via the insulating film; and the n-type semiconductor portion embedded in another part of the trench via the insulating film and provided so as to contact with the p-type semiconductor portion.

Consequently, the gate protection diode and the temperature detection diode can be formed in the trench and, as a result, the flatness of the semiconductor device including the trench gate type IGBT and the optional element can be enhanced. Therefore, according to the basic idea, it is possible to avoid the complication and the increased difficulty of the manufacturing process due to the step in the manufacturing process of the semiconductor device.

In the following, an embodiment that has embodied the above-mentioned basic idea will be described.

First Embodiment

A first embodiment will describe an example in which the basic idea is embodied as the temperature detection diode.

Configuration of Temperature Detection Diode

Figure 3:
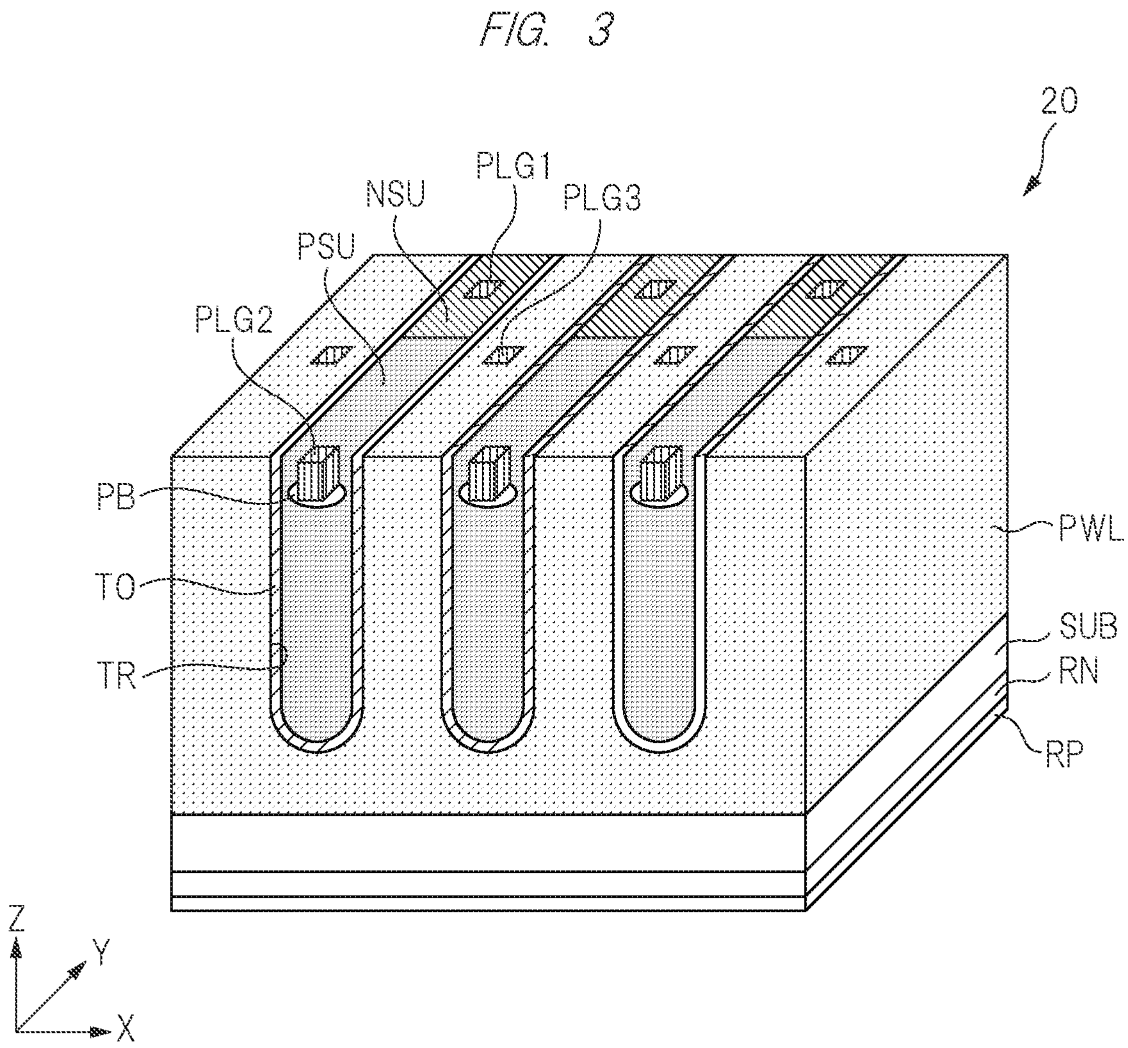
FIG. 3 is a perspective view showing a configuration of a temperature detection diode in a first embodiment.

FIG. 3 is a perspective view showing a schematic configuration of the temperature detection diode 20 in a first embodiment. Here, the semiconductor substrate SUB has the element formation region, and the temperature detection diode 20 shown in FIG. 3 is formed in a part of this element formation region.

Meanwhile, although not shown in FIG. 3, a power transistor is formed in the element formation region of the semiconductor substrate SUB in addition to the temperature detection diode 20. Then, the power transistor is configured of, for example, the trench gate type IGBT. Incidentally, a device structure of the trench gate type IGBT here is the same as a device structure of a well-known trench gate type IGBT, so that a description of the device structure of the trench gate type IGBT will be omitted.

In FIG. 3, a backside n-type buffer layer RN for suppressing extension of a depletion layer and a backside p-type layer RP to which a collector potential is supplied are provided on the back surface of the semiconductor substrate SUB made of, for example, a silicon substrate. Meanwhile, a p-type layer PWL to which an emitter potential is supplied is provided on a front surface of the semiconductor substrate SUB. That is, the p-type layer PWL is connected to the emitter potential of the trench gate type IGBT.

As shown in FIG. 3, a plurality of trenches TR is provided in the p-type layer PWL. An insulating film TO made of, for example, a silicon oxide film is formed on the inner wall of each of the plurality of trenches TR. Then, a p-type semiconductor portion PSU is embedded in a part of the trench TR via the insulating film TO. Meanwhile, an n-type semiconductor portion NSU is embedded in another part of the trench TR via the insulating film TO. In this case, the p-type semiconductor portion PSU and the n-type semiconductor portion NSU contact with each other. As a result, the pn junction is formed in the contact region between the p-type semiconductor portion PSU and the n-type semiconductor portion NSU. Thus, the p-type semiconductor portion PSU and the n-type semiconductor portion NSU form the pn junction diode. This pn junction diode functions as the temperature detection diode 20. That is, the temperature detection diode 20 in the first embodiment is configured of the p-type semiconductor portion PSU embedded in the trench TR and the n-type semiconductor portion NSU embedded in the trench TR.

Here, the p-type semiconductor portion PSU is made of, for example, a polysilicon film into which boron is introduced as an acceptor. In contrast, the n-type semiconductor portion NSU is made of, for example, a polysilicon film into which arsenic and phosphorus are introduced as a donor.

Next, as shown in FIG. 3, the n-type semiconductor portion NSU is electrically connected to a plug PLG1, while the p-type semiconductor portion PSU is electrically connected to a plug PLG2. In this case, a p-type back gate layer PB is provided so as to contact with a bottom of the plug PLG2. Incidentally, although not shown in FIG. 3, the p-type back gate layer PB is similarly provided so as to contact with a bottom of the plug PLG1.

Further, as shown in FIG. 3, a plug PLG3 electrically connected to the p-type layer PWL to which the emitter potential is supplied is provided between the two adjacent trenches TR among the plurality of trenches TR. Then, considering that the p-type layer PWL is connected to the emitter potential of the trench gate type IGBT, the plug PLG3 is connected to the emitter potential of the trench gate type IGBT which is a power transistor.

The temperature detection diode 20 is configured as described above.

Furthermore, a configuration of the temperature detection diode 20 will be described.

Figure 4B:
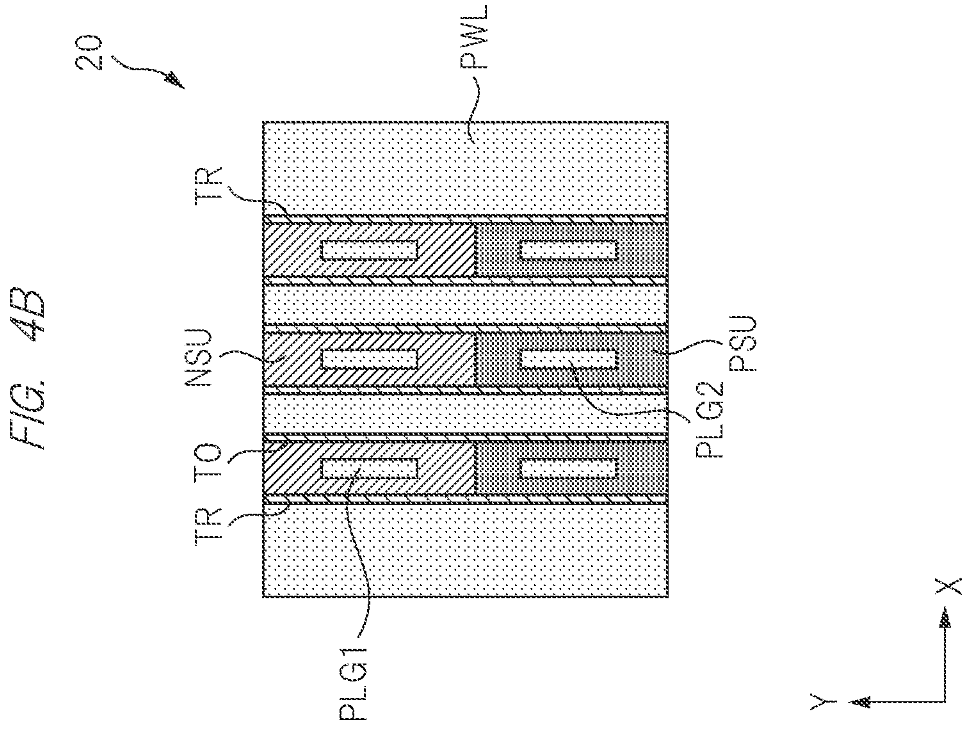
FIG. 4B is a top view showing a configuration from which a cathode electrode and an anode electrode shown in FIG. 4A are removed.
Figure 4A:
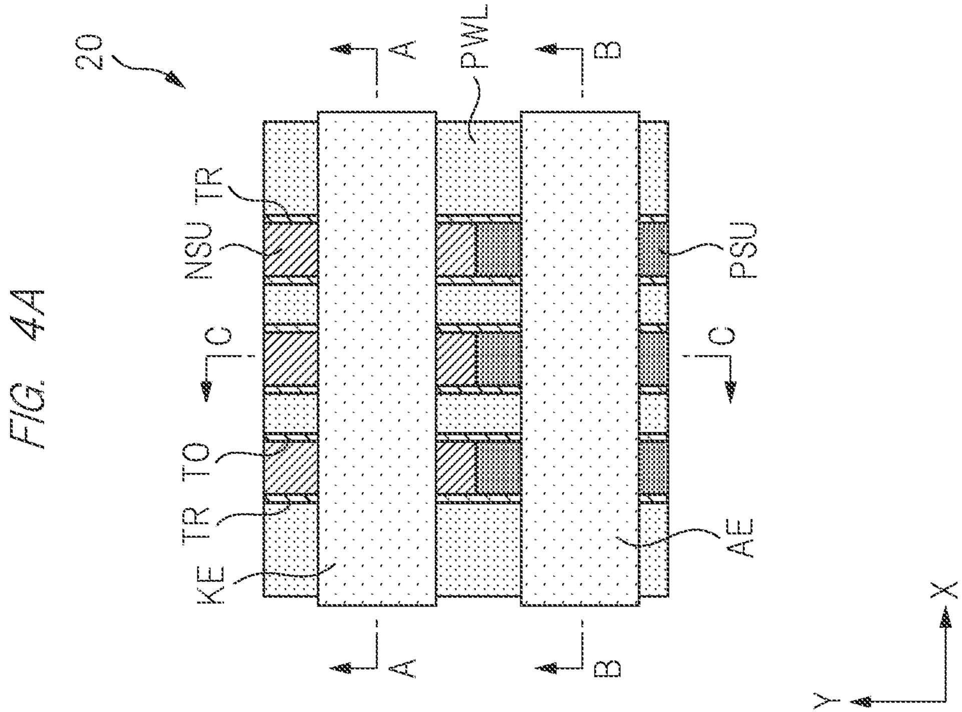
FIG. 4A is a top view of the temperature detection diode.

FIG. 4A is a top view of the temperature detection diode 20. In FIG. 4A, a plurality of trenches TR is provided in the p-type layer PWL. Particularly, the plurality of trenches TR is arranged alongside in an X direction, and each of the plurality of trenches TR extends in a Y direction. Here, the X direction and the Y direction are along the front surface of the semiconductor substrate SUB and perpendicular to each other. Then, the p-type semiconductor portion PSU and the n-type semiconductor portion NSU are embedded in each of the plurality of trenches TR. In this case, a cathode electrode KE extending in the X direction is arranged over the n-type semiconductor portion NSU, while an anode electrode AE extending in the X direction is arranged over the p-type semiconductor portion PSU.

FIG. 4B is a top view showing a configuration from which the cathode electrode KE and the anode electrode AE shown in FIG. 4A are removed. As shown in FIG. 4B, the n-type semiconductor portion NSU is electrically connected to the plug PLG1. Therefore, it can be seen from FIGS. 4A and 4B that the n-type semiconductor portion NSU is electrically connected to the cathode electrode KE via the plug PLG1. Similarly, from FIGS. 4A and 4B, the p-type semiconductor portion NSU is electrically connected to the anode electrode AE via the plug PLG2.

Subsequently, a cross-sectional structure of the temperature detection diode 20 will be described. There are two types of cross-sectional structures of the temperature detection diode 20 in the first embodiment. Therefore, hereinafter, a first type of cross-sectional structure of the temperature detection diode 20 is referred to as "Type 1", a second type of cross-sectional structure of the temperature detection diode 20 is referred to as "Type 2", and each will be described.

"Type 1" of Structure

Figures 5A, 5B, 5C:
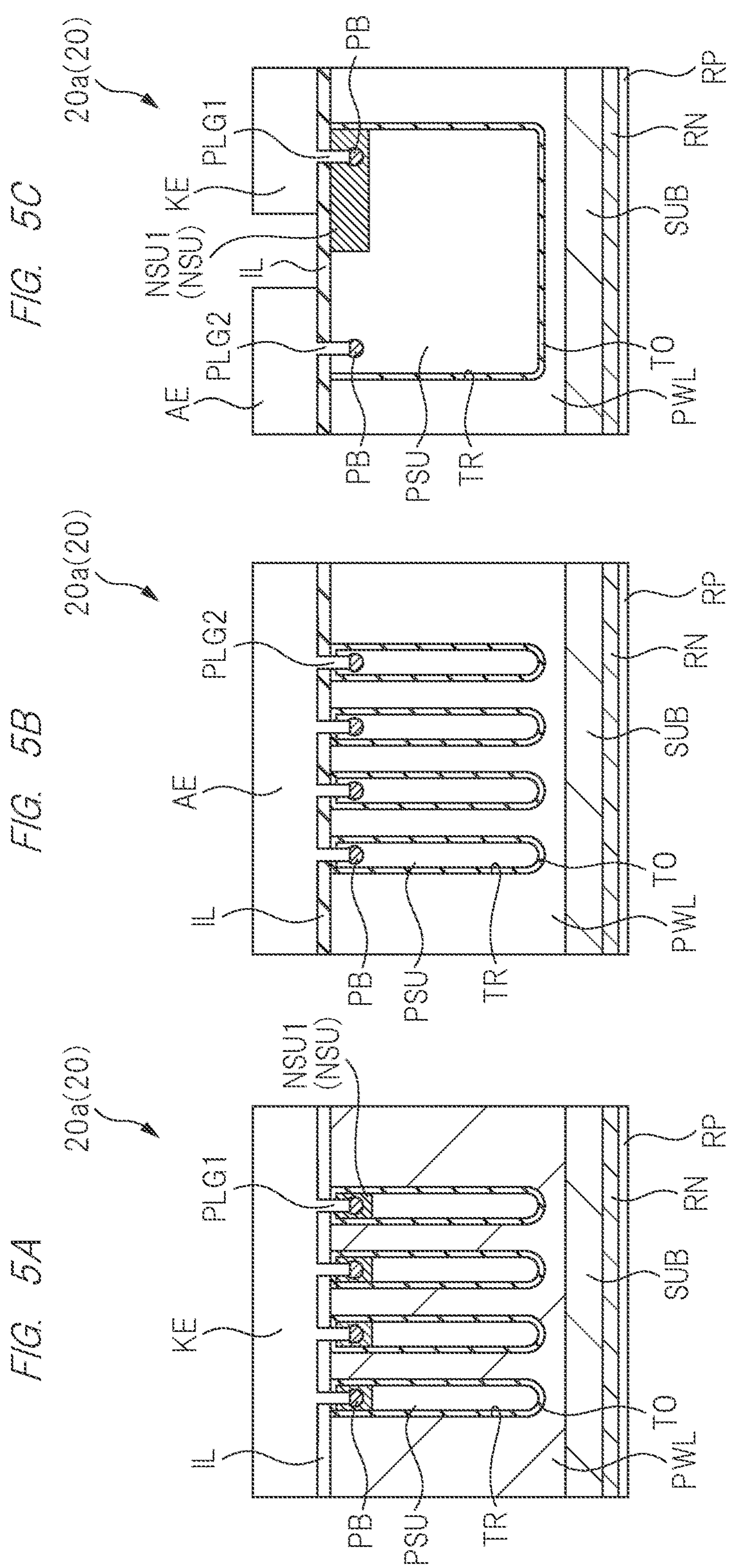
FIG. 5A is a sectional view of a temperature detection diode of "Type 1" along line A-A in FIG. 4A.
FIG. 5B is a sectional view of a temperature detection diode of "Type 1" along line B-B in FIG. 4A.
FIG. 5C is a sectional view of a temperature detection diode of "Type 1" along line C-C in FIG. 4A.

Particularly, FIG. 5A is a sectional view of a temperature detection diode 20*a* of "Type 1" along line A-A of FIG. 4A, FIG. 5B is a sectional view of the temperature detection diode 20*a* of "Type 1" along line B-B of FIG. 4A, and FIG. 5C is a sectional view of the temperature detection diode 20*a* of "Type 1" along line C-C of FIG. 4A.

In FIG. 5A, the p-type semiconductor portion PSU and the n-type semiconductor portion NSU1 are embedded in the trench TR via the insulating film TO. In this case, the n-type semiconductor portion NSU1 is provided on and above the p-type semiconductor portion PSU. Arsenic (As) is introduced as a donor into this n-type semiconductor portion NSU1. In the "Type 1", the plug PLG1 is arranged to reach the n-type semiconductor portion NSU1, and the p-type back gate layer PB is provided at the bottom of the plug PLG1. The plug PLG1 penetrates through an interlayer insulating film IL formed on the trench TR, and is electrically connected to the cathode electrode KE formed on the interlayer insulating film IL. Consequently, the n-type semiconductor portion NSU1 embedded in the trench TR is electrically connected to the cathode electrode KE via the plug PLG1.

Next, in FIG. 5B, the p-type semiconductor portion PSU is embedded in the trench TR via the insulating film TO. Boron (B) is introduced as an acceptor into the p-type semiconductor portion PSU. In the "Type 1", the plug PLG2 is arranged to reach the p-type semiconductor portion PSU, and the p-type back gate layer PB is provided at the bottom of the plug PLG2. The plug PLG2 penetrates through the interlayer insulating film IL formed on the trench TR, and is electrically connected to the anode electrode AE formed on the interlayer insulating film IL. Consequently, the p-type semiconductor portion PSU embedded in the trench TR is electrically connected to the anode electrode AE via the plug PLG2.

Subsequently, in FIG. 5C, an n-type semiconductor portion NSU1 and the p-type semiconductor portion PSU are embedded via the insulating film TO in the trench TR. Here, as shown in FIG. 5C, the p-type semiconductor portion PSU is embedded in most of the trench TR, and the p-type semiconductor portion PSU reaches the bottom of the trench TR. In contrast, the n-type semiconductor portion NSU1 embedded in the trench TR is smaller than the p-type semiconductor portion PSU and does not reach the bottom of the trench TR. Then, the n-type semiconductor portion NSU1 is electrically connected to the cathode electrode KE via the plug PLG1, while the p-type semiconductor portion PSU is electrically connected to the anode electrode AE via the plug PLG2.

As described above, in the "Type 1", the p-type semiconductor portion PSU and the n-type semiconductor portion NSU1 are embedded in the trench TR, and the p-type semiconductor portion PSU and the n-type semiconductor portion NSU1 contact with each other, thereby forming the pn junction. As a result, in the "Type 1", the pn junction diode is formed in the trench TR, and this pn junction diode functions as the temperature detection diode 20*a*.

Structure of "Type 2"

Figures 6A, 6B, 6C:
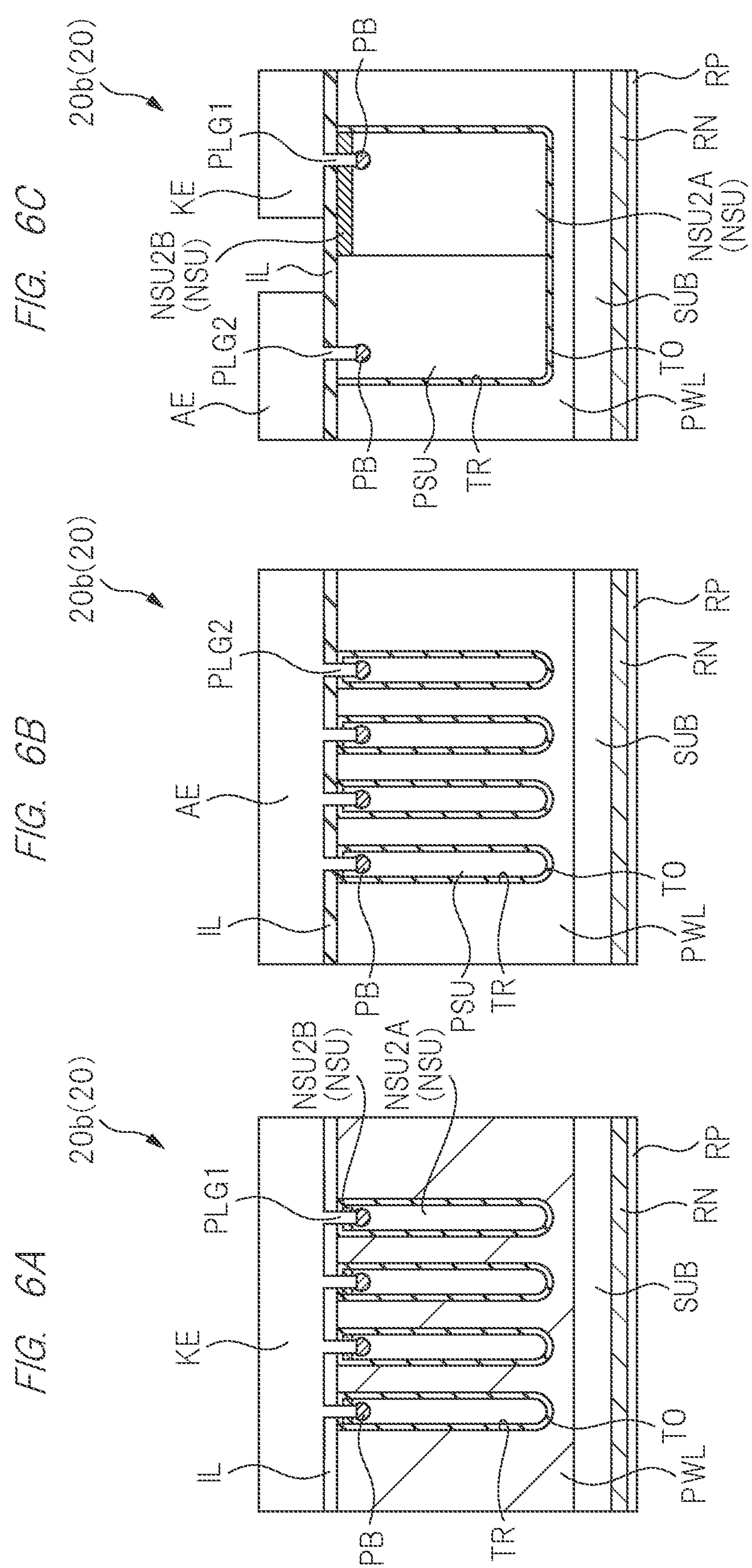
FIG. 6A is a sectional view of a temperature detection diode of "Type 2" along line A-A in FIG. 4A.
FIG. 6B is a sectional view of a temperature detection diode of "Type 2" along line B-B in FIG. 4A.
FIG. 6C is a sectional view of a temperature detection diode of "Type 2" along line C-C in FIG. 4A.

In particular, FIG. 6A is a sectional view of a temperature detection diode 20*b* of "Type 2" along line A-A in FIG. 4A, FIG. 6B is a sectional view of the temperature detection diode 20*b* of "Type 2" along line B-B in FIG. 4A, and FIG. 6C is a sectional view of the temperature detection diode 20*b* of "Type 2" along line C-C of FIG. 4A.

In FIG. 6A, an n-type semiconductor portion NSU2A and an n-type semiconductor portion NSU2B are embedded in the trench TR via the insulating film TO. In this case, the n-type semiconductor portion NSU2B is provided on and above the n-type semiconductor portion NSU2A. Phosphorus (P) is introduced as a donor into this n-type semiconductor portion NSU2A. Meanwhile, arsenic (As) is introduced as a donor into the n-type semiconductor portion NSU2B.

Further, in the "Type 2", the plug PLG1 is arranged to reach the n-type semiconductor portion NSU2B, and the p-type back gate layer PB is provided at the bottom of the plug PLG1. The plug PLG1 penetrates through the interlayer insulating film IL formed on the trench TR, and is electrically connected to the cathode electrode KE formed on the interlayer insulating film IL. Consequently, the n-type semiconductor portion NSU2A and the n-type semiconductor portion NSU2B embedded in the trench TR are electrically connected to the cathode electrode KE via the plug PLG1.

Next, in FIG. 6B, the p-type semiconductor portion PSU is embedded in the trench TR via the insulating film TO. Boron (B) is introduced as an acceptor into the p-type semiconductor portion PSU. Also in the "Type 2", the plug PLG2 is arranged so as to reach the p-type semiconductor portion PSU, and the p-type back gate layer PB is provided at the bottom of the plug PLG2. The plug PLG2 penetrates through the interlayer insulating film IL formed on the trench TR, and is electrically connected to the anode electrode AE formed on the interlayer insulating film IL. Consequently, the p-type semiconductor portion PSU embedded in the trench TR is electrically connected to the anode electrode AE via the plug PLG2.

Subsequently, in FIG. 6C, the n-type semiconductor portion NSU2A, the n-type semiconductor portion NSU2B, and the p-type semiconductor portion PSU are embedded in the trench TR via the insulating film TO. Here, as shown in FIG. 6C, the p-type semiconductor portion PSU and the n-type semiconductor portion NSU2A reach the bottom of the trench TR. In contrast, the n-type semiconductor portion NSU2B is formed on the n-type semiconductor portion NSU2A, and is formed on the front surface of the trench TR. Then, the n-type semiconductor portion NSU2B is electrically connected to the cathode electrode KE via the plug PLG1, while the p-type semiconductor portion PSU is electrically connected to the anode electrode AE via the plug PLG2.

As described above, in the "Type 2", the p-type semiconductor portion PSU, the n-type semiconductor portion NSU2A, and the n-type semiconductor portion NSU2B are embedded in the trench TR.

Then, the p-type semiconductor portion PSU and the n-type semiconductor portion NSU2A contact with each other to form the pn junction, and the p-type semiconductor portion PSU and the n-type semiconductor portion NSU2B contact with each other to form the pn junction. As a result, even in the "Type 2", the pn junction diode is formed in the trench TR, and this pn junction diode functions as the temperature detection diode 20*b*.

Structural Features of First Embodiment

Next, a structural feature point of the first embodiment will be described. A structural feature point of the first embodiment is that, for example as shown in FIGS. 3 to 6C, the temperature detection diode 20 is provided in the trench TR. Namely, in the first embodiment, the basic idea that the trench is formed in the semiconductor substrate and the p-type semiconductor portion and the n-type semiconductor portion are provided in the trench via the insulating film is used, and there is a structural feature point in that the temperature detection diode 20 is formed in the trench TR. Then, according to this feature point, the flatness of the semiconductor device including the trench gate type IGBT and the temperature detection diode 20 can be enhanced as a result of eliminating a step occurrence factor due to forming the temperature detection diode by using the polysilicon film formed on the semiconductor substrate.

Manufacturing Method of Semiconductor Device (1) First, a manufacturing method of a semiconductor device including a temperature detection diode 20*a* of "Type 1" and the trench gate type IGBT will be briefly described.

This manufacturing method of a semiconductor device includes: (a) forming a gate trench in a first region of the semiconductor substrate, and forming the trench TR in a second region of the semiconductor substrate; (b) forming the gate electrode in the gate trench, and forming the insulating film TO on the inner wall of the trench TR; (c) forming the gate electrode in the gate trench; (d) forming the p-type semiconductor portion PSU in the trench TR; and (e) forming the n-type semiconductor portion NSU1 contacting with the p-type semiconductor portion PSU in the trench TR.

Here, the manufacturing method of the semiconductor device has (f) forming an emitter region of the trench gate type IGBT. At this time, from the viewpoint of manufacture easiness, it is desired that the "(e) process" of forming the n-type semiconductor portion NSU1 can utilize the "(f) process" of forming the emitter region of the trench gate type IGBT. However, from the viewpoint described below, the "(e) process" of forming the n-type semiconductor portion NSU1 is preferably a separate process from the "(f) process" of forming the emitter region of the trench gate type IGBT.

This is because the n-type semiconductor portion NSU1 needs to be formed up to a position deeper than the emitter region of the trench gate type IGBT. That is, the depth of the emitter region of the trench gate type IGBT is a depth at which a contact plug penetrates through the emitter region. In contrast, if the plug PLG1 is formed so as to penetrate through the n-type semiconductor portion NSU1 and reach the p-type semiconductor portion PSU, the cathode electrode KE is electrically connected to the p-type semiconductor portion PSU via the plug PLG1 resulting in that the temperature detection diode 20*a* of "Type 1" stops functioning. Namely, in the temperature detection diode 20*a* of "Type 1", the n-type semiconductor portion NSU1 needs to have such a depth that the plug PLG1 does not penetrate through the n-type semiconductor portion NSU1 and the p-type back gate layer PB formed at the bottom of the plug PLG1 does not contact with the p-type semiconductor portion PSU (see FIG. 5C). That is, the depth of the n-type semiconductor portion NSU1 needs to be greater than a length from the front surface of the semiconductor substrate to the bottommost portion of the p-type back gate layer PB.

(2) Next, a manufacturing method of the semiconductor device including a temperature detection diode 20*b* of "Type 2" and the trench gate type IGBT will be described with reference to the drawings.

This manufacturing method of the semiconductor device will be described with reference to FIGS. 7 to 19. Here, each of FIGS. 7A to 19A shows a cell formation region RA in which the trench gate type IGBT is formed and a temperature detection diode formation region RB in which the temperature detection diode is formed. Then, in the temperature detection diode formation region RB, a sectional view along line A-A and a sectional view along line B-B of FIG. 4A are shown. Meanwhile, each of FIGS. 7B to 19B shows a sectional view along line C-C of FIG. 4A.

Figure 7A:
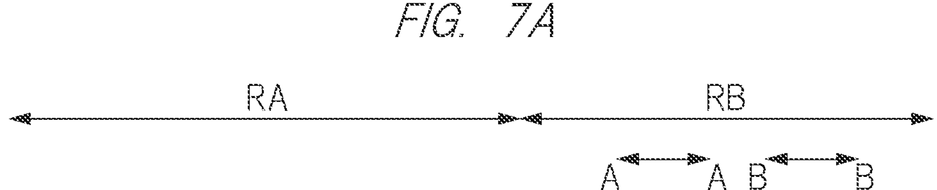
FIGS. 7A and 7B are diagrams each showing a manufacturing process of a semiconductor device including a temperature detection diode of "Type 2" and a trench gate type IGBT.
Figure 7A:
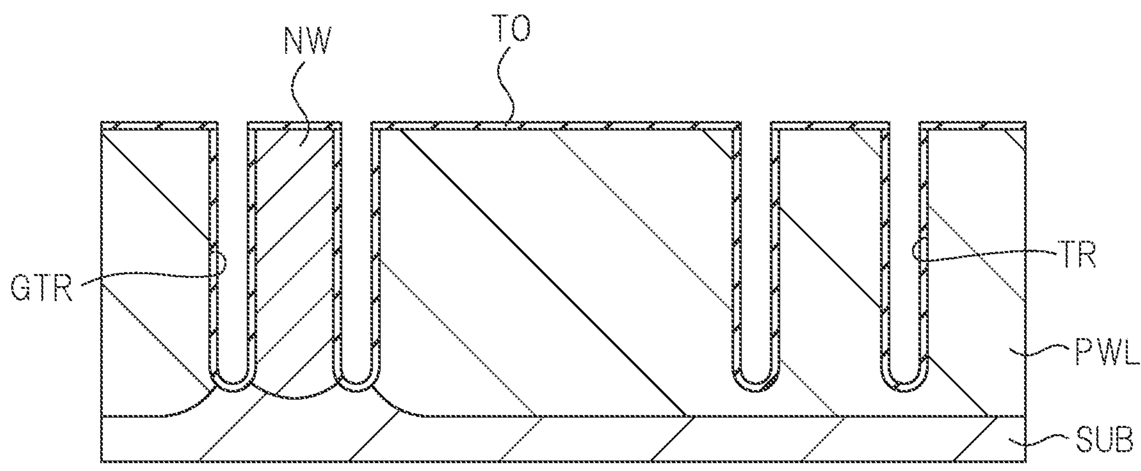
Figure 7B:
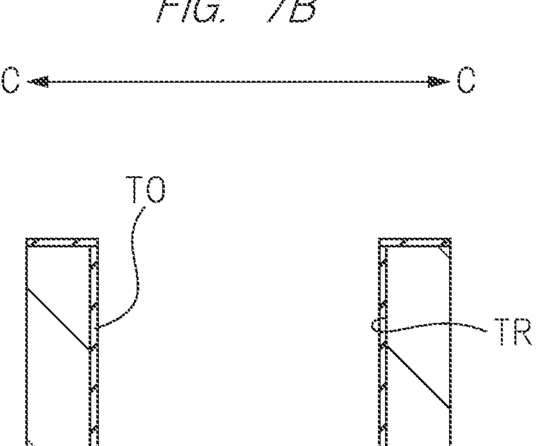

First, as shown in FIGS. 7A and 7B, the p-type layer PWL functioning as a p-type well and an n-type layer NW functioning as a hole barrier layer are formed in the semiconductor substrate SUB made of, for example, an n-type silicon substrate. Thereafter, by using a photolithography technique and an etching technique, the gate trench GTR is formed in the cell formation region RA, and the trench TR is formed in the temperature detection diode formation region RB. Thereafter, the insulating film TO made of, for example, a silicon oxide film is formed on the front surface of the semiconductor substrate SUB (more precisely, a front surface of the p-type layer PWL) including the inner wall of the gate trench GTR and the inner wall of the trench TR.

Figure 8A:
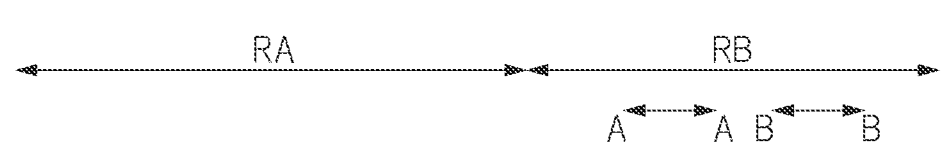
FIGS. 8A and 8B are diagrams each showing a manufacturing process following FIG. 7.
Figure 8A:
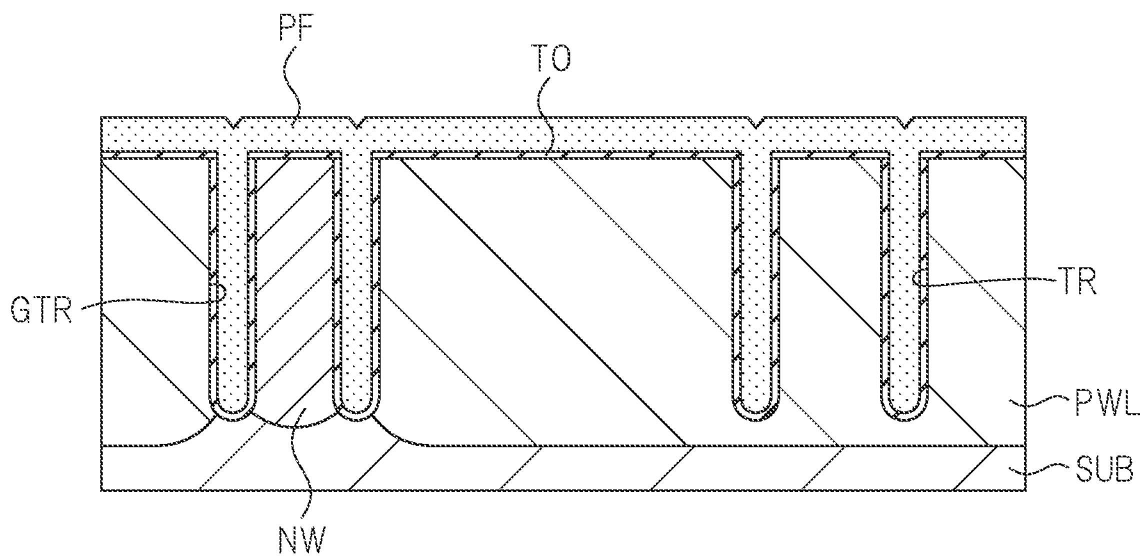
Figure 8B:
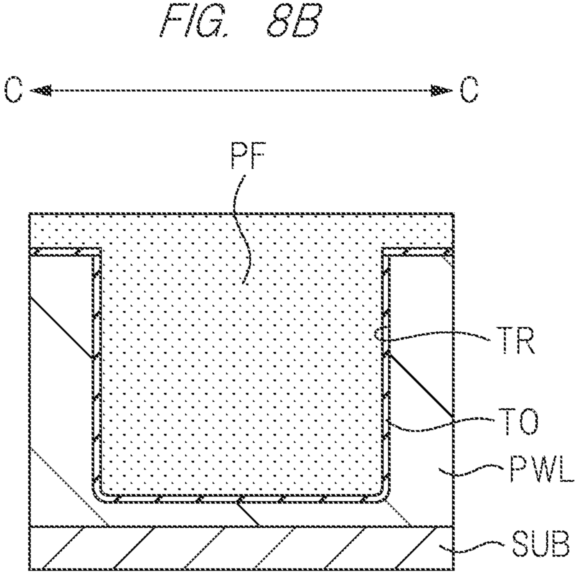

Next, as shown in FIGS. 8A and 8B, a polysilicon film PF is formed on the insulating film TO so as to fill an inside of the gate trench GTR and an inside of the trench TR. The polysilicon film PF is a polysilicon film into which an extremely small amount of impurity is introduced, or an intrinsic polysilicon film. The intrinsic polysilicon film is a polysilicon film into which conductivity type impurities (donors and acceptors) are not introduced. The polysilicon film PF can be formed by using, for example, a CVD (Chemical Vapor Deposition) method.

Figure 9A:
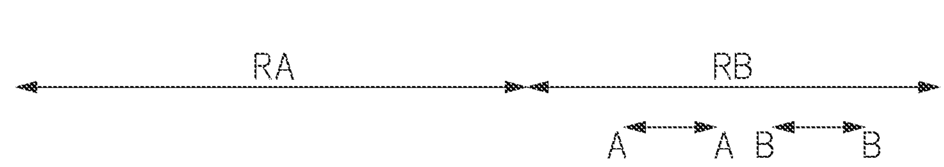
FIGS. 9A and 9B are diagrams each showing a manufacturing process following FIG. 8.
Figure 9A:
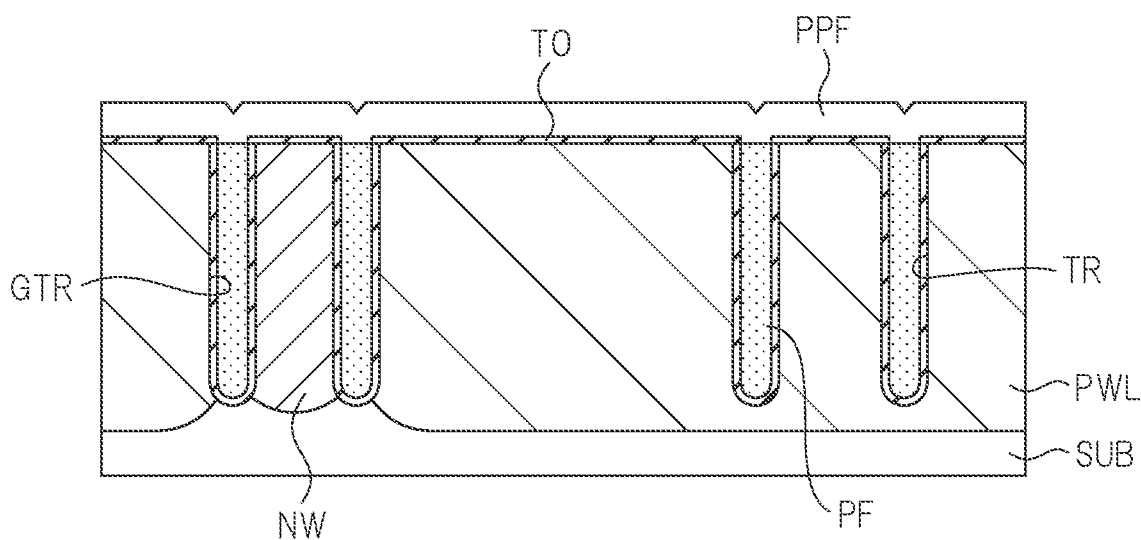
Figure 9B:
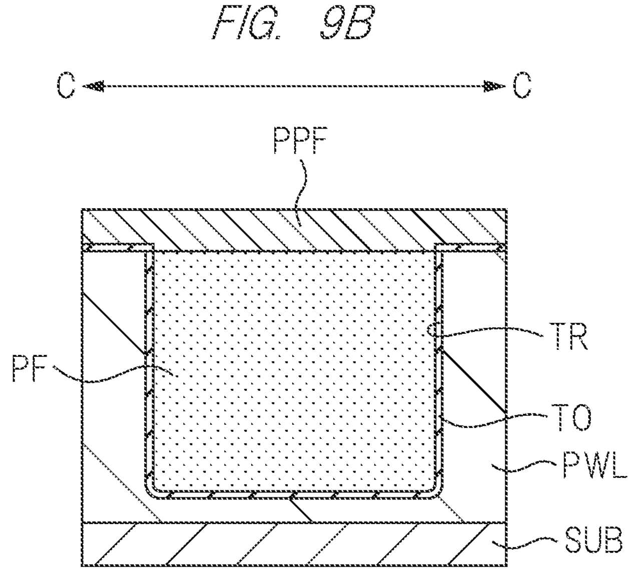

Subsequently, as shown in FIGS. 9A and 9B, for example, an ion implantation method is used to introduce boron (B), which functions as an acceptor, into the polysilicon film PF formed on the front surface of the p-type layer PWL, which forms the polysilicon film PF into a p-type polysilicon film PPF. At this time, boron is not introduced into the polysilicon film PF embedded in the gate trench GTR and the polysilicon film PF embedded in the trench TR. Alternatively, some boron may be introduced up to a top of the polysilicon film PF embedded in the trench TR within such a range that the n-type semiconductor portion NSU2A is not difficult to form.

Figure 10A:
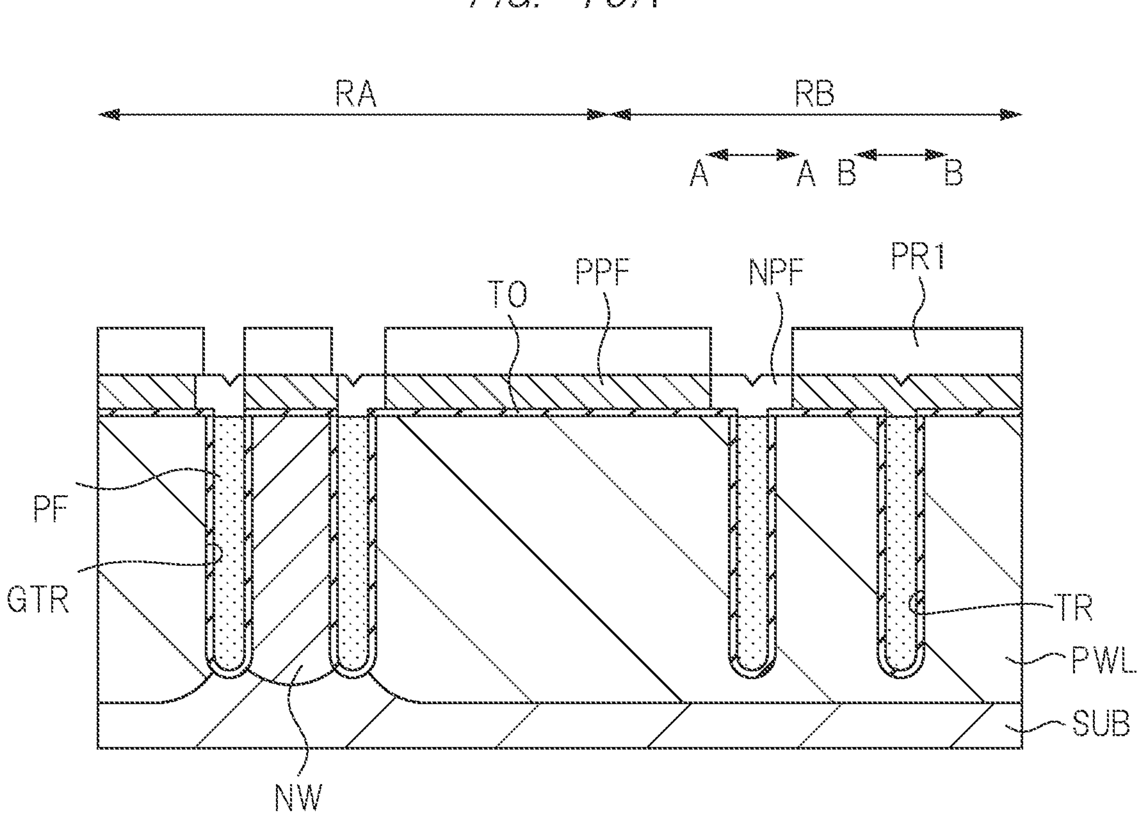
FIGS. 10A and 10B are diagrams each showing a manufacturing process following FIG. 9.
Figure 10B:
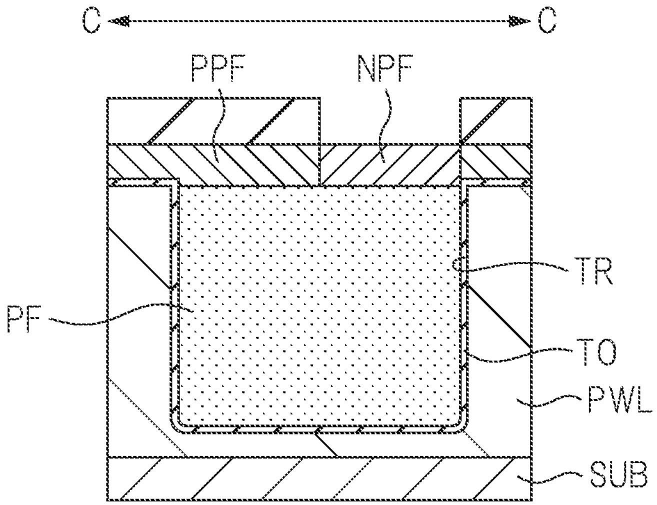

Then, as shown in FIGS. 10A and 10B, after a resist film PR1 is applied onto the p-type polysilicon film PPF, the resist film PR1 is subjected to exposure and development treatment to pattern the resist film PR1. The patterning of the resist film PR1 is performed so as to expose a region into which phosphorus (P) is introduced. Thereafter, by the ion implantation method using the patterned resist film PR1 as a mask, the region of the p-type polysilicon film PPF exposed from the resist film PR1 is counter-doped with phosphorus functioning as a donor. Consequently, the phosphorus-introduced region changes into the n-type polysilicon film NPF. Incidentally, also in this process, phosphorus is not introduced into the polysilicon film PF embedded in the gate trench GTR and the polysilicon film PF embedded in the trench TR. Alternatively, some phosphorus may be introduced up to the top of the polysilicon film PF embedded in the trench TR within such a range that the p-type semiconductor portion PSU is not difficult to form.

Here, as shown in FIG. 10A, in the cell formation region RA, the n-type polysilicon film NPF is formed so as to contact with the polysilicon film PF embedded in the gate trench GTR. Further, as shown in FIG. 10B, in the temperature detection diode formation region RB, the n-type polysilicon film NPF is formed so as to contact with part of the polysilicon film PF embedded in the trench TR. Along with this, the p-type polysilicon film PPF is formed so as to contact with another part of the polysilicon film PF.

Figure 11A:
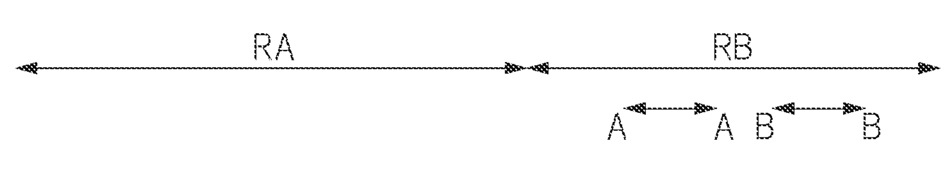
FIGS. 11A and 11B are diagrams each showing a manufacturing process following FIG. 10.
Figure 11A:
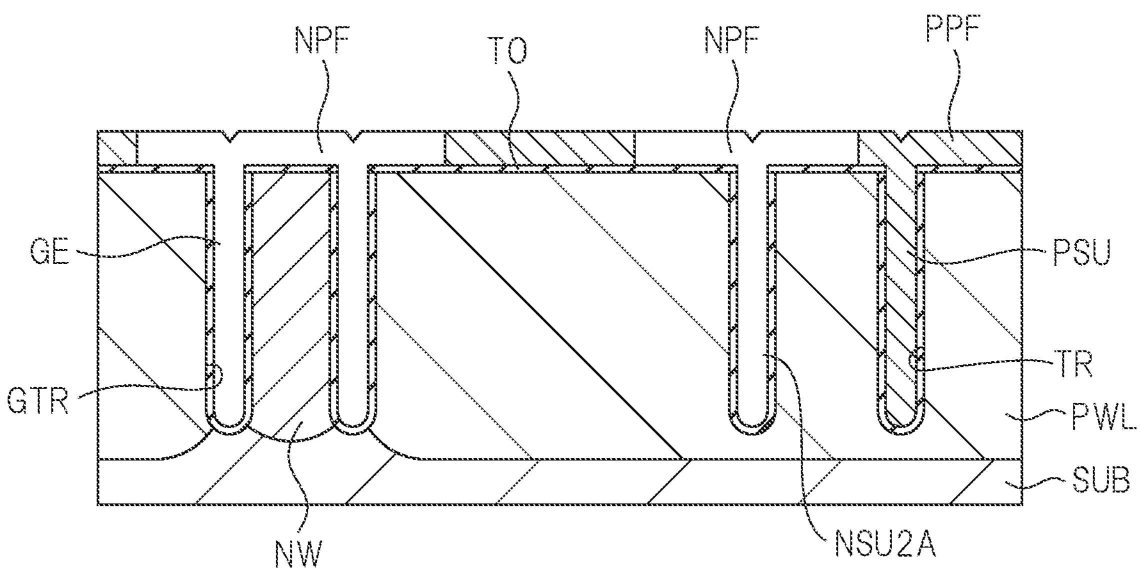
Figure 11B:
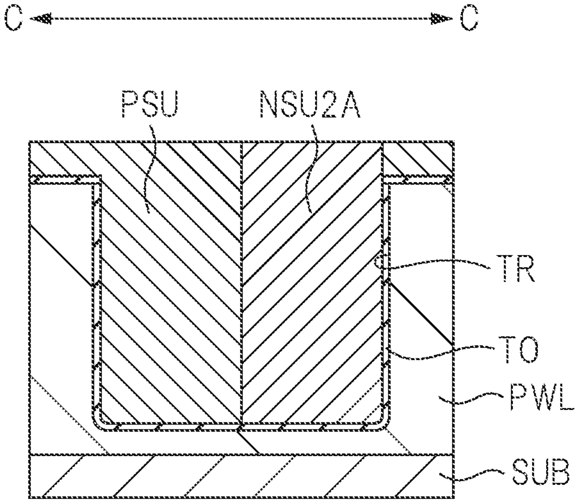

Next, the semiconductor substrate SUB is subjected to a heat treatment (annealing treatment) at, for example, 1100° C. Consequently, as shown in FIG. 11A, in the cell formation region RA, phosphorus diffuses from the n-type polysilicon film NPF into the polysilicon film PF embedded in the gate trench GTR. As a result, the gate electrode GE made of the n-type polysilicon film is formed in the gate trench GTR. Meanwhile, as shown in FIG. 11B, in the temperature detection diode formation region RB, phosphorus is diffused into the trench TR from the n-type polysilicon film NPF, which contacts with a part of the polysilicon film PF embedded in the trench TR, to form the n-type semiconductor portion NSU2A and, simultaneously, Boron is diffused into the trench TR from the p-type polysilicon film PPF, which contacts with another part of the polysilicon film PF embedded in the trench TR, to form the p-type semiconductor portion PSU. As a result, the n-type semiconductor portion NSU2A and the p-type semiconductor portion PSU, which contact with each other, are formed in the trench TR. Namely, the pn junction diode is formed in the trench TR.

As described above, in the first embodiment, the process of forming the gate electrode GE in the gate trench GTR in the cell formation region RA, and the process of forming the n-type semiconductor portion NSU2A in a part of the trench TR in the temperature detection diode formation region RB and forming the p-type semiconductor portion PSU in another part of the trench TR can be performed in the same process.

Figure 12A:
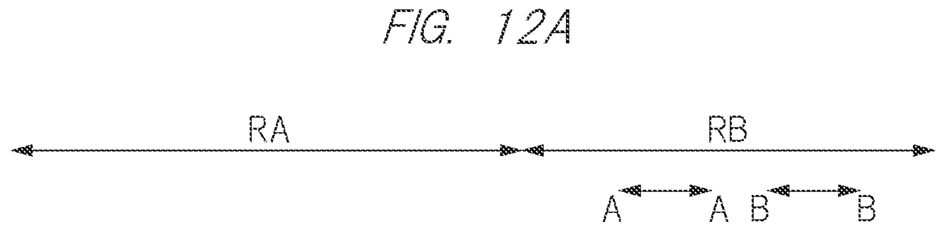
FIGS. 12A and 12B are diagrams each showing a manufacturing process following FIG. 11.
Figure 12A:
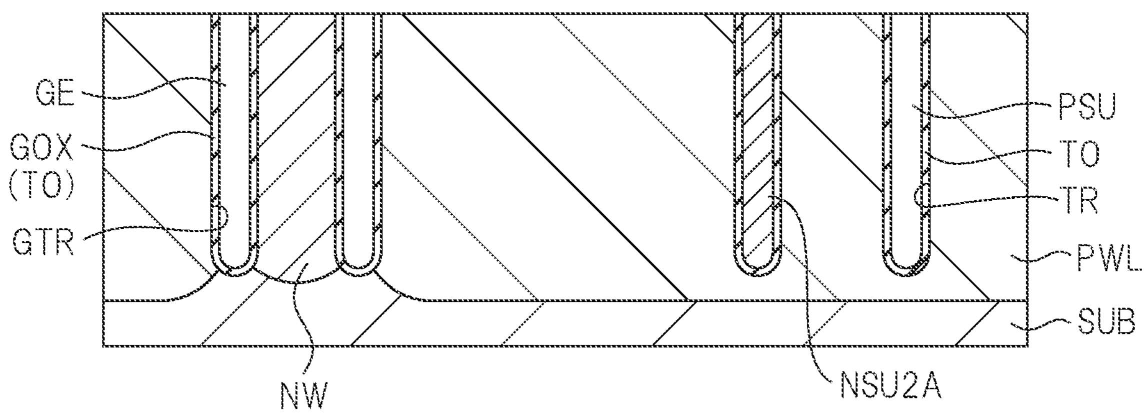
Figure 12B:
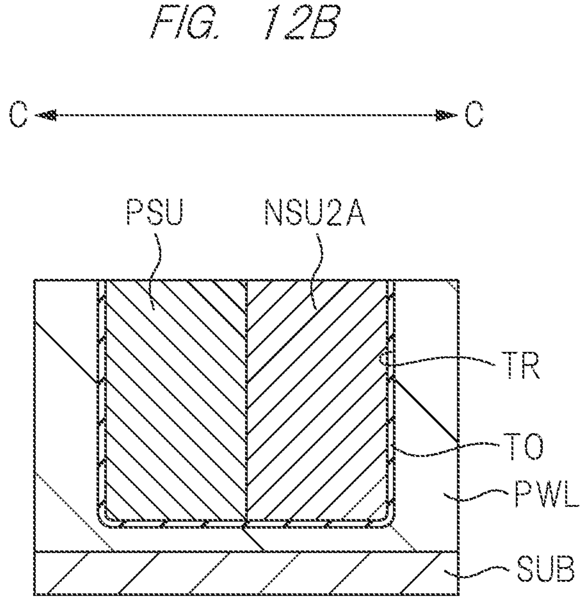

Subsequently, as shown in FIGS. 12A and 12B, the p-type polysilicon film PPF and the n-type polysilicon film PPF formed on the p-type layer PWL are removed by using, for example, an etching technique. Furthermore, the exposed insulating film TO is removed by using, for example, an etching technique. At this time, in the cell formation region RA, the insulating film TO remaining on the inner wall of the gate trench GTR functions as a gate insulating film GOX.

Figure 13A:
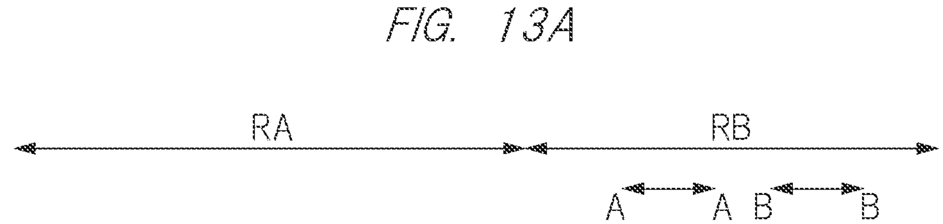
FIGS. 13A and 13B are diagrams each showing a manufacturing process following FIG. 12.
Figure 13A:
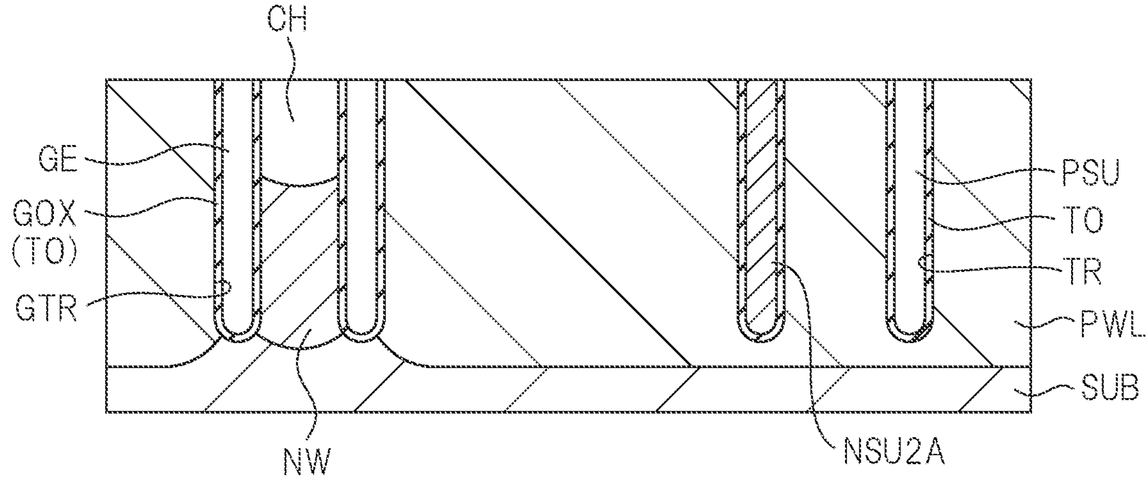
Figure 13B:
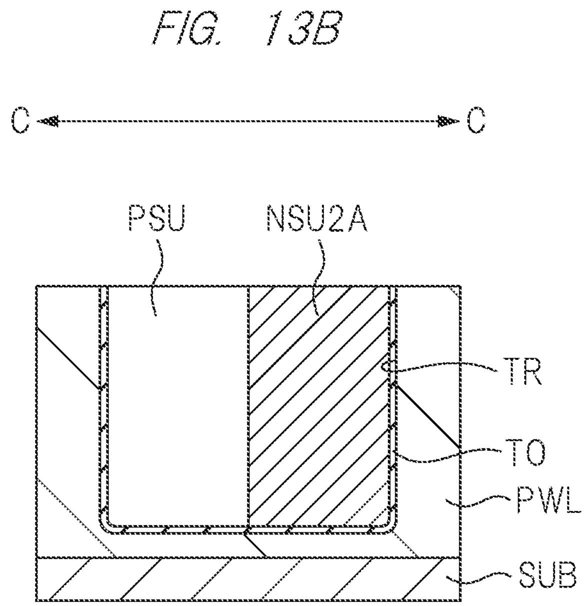

Next, as shown in FIGS. 13A and 13B, for example, by using a photolithography technique and an ion implantation method, in the cell formation region RA, Boron is introduced into a front surface region of the n-type layer NW formed in a region located between the gate trenches GTR next to each other. This makes it possible to form the channel layer CH that is a p-type layer.

Figure 14A:
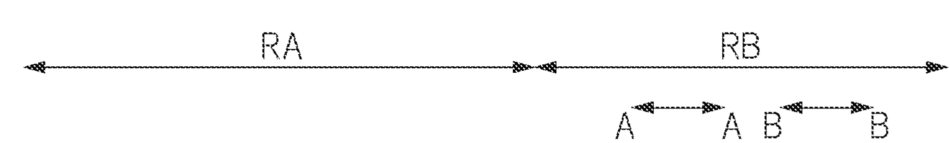
FIGS. 14A and 14B are diagrams each showing a manufacturing process following FIG. 13.
Figure 14A:
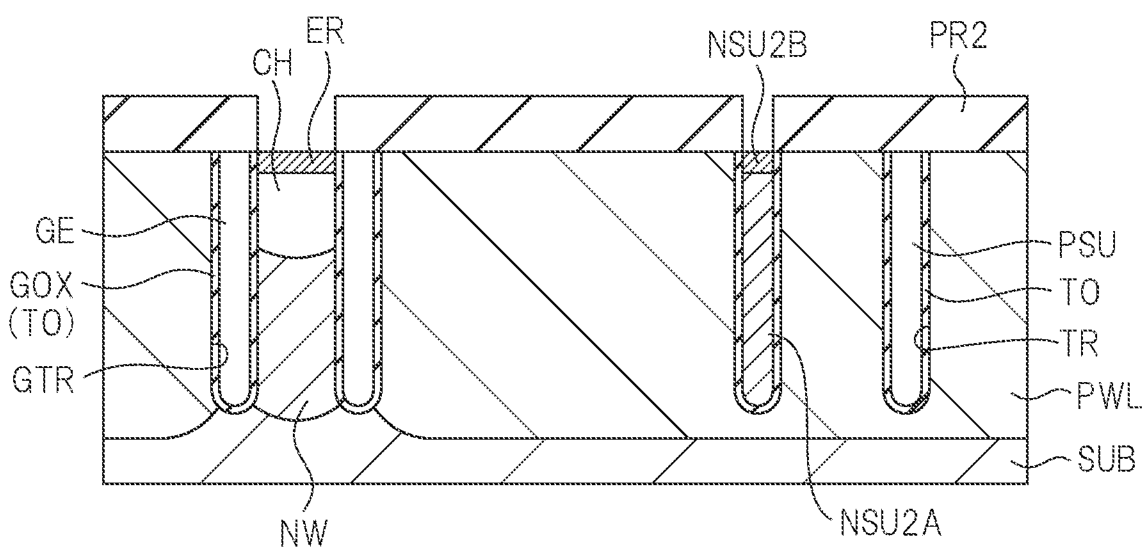
Figure 14B:
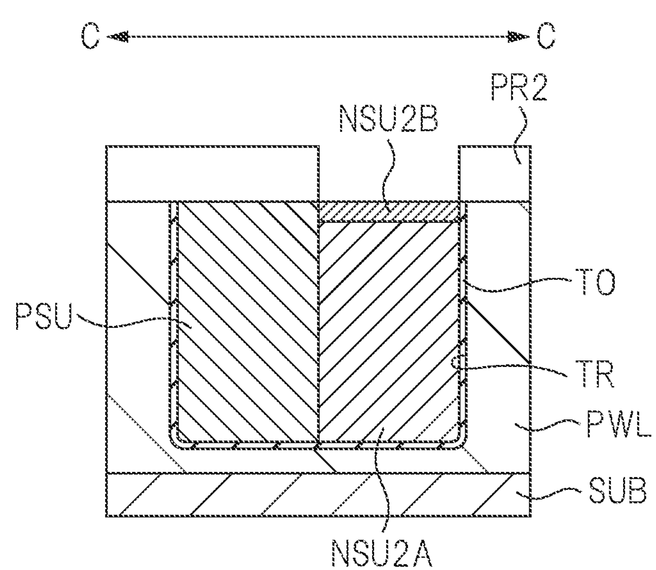

Thereafter, as shown in FIGS. 14A and 14B, after a resist film PR2 is applied on the front surface of the p-type layer PWL, this resist film PR2 is subjected to exposure and development treatments, thereby patterning the resist film PR2. The patterning of the resist film PR2 is performed so as to expose a region into which arsenic functioning as a donor is introduced. Then, arsenic is introduced by the ion implantation method using the patterned resist film PR2 as a mask. Consequently, in the cell formation region RA, the emitter region ER, which is an n-type semiconductor region, is formed in a front surface region of the channel layer CH.

Meanwhile, in the temperature detection diode formation region RB, the n-type semiconductor portion NSU2B is formed by introducing arsenic into the front surface region of the phosphorus-introduced n-type semiconductor portion NSU2A. Thus, in the first embodiment, the process of forming the emitter region ER in the cell formation region RA, and the process of forming the n-type semiconductor portion NSU2B in the temperature detection diode formation region RB can be performed in the same process.

Figure 15A:
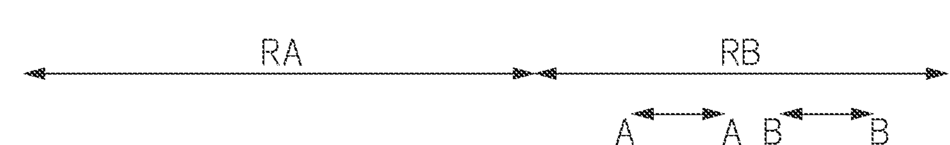
FIGS. 15A and 15B are diagrams each showing a manufacturing process following FIG. 14.
Figure 15A:
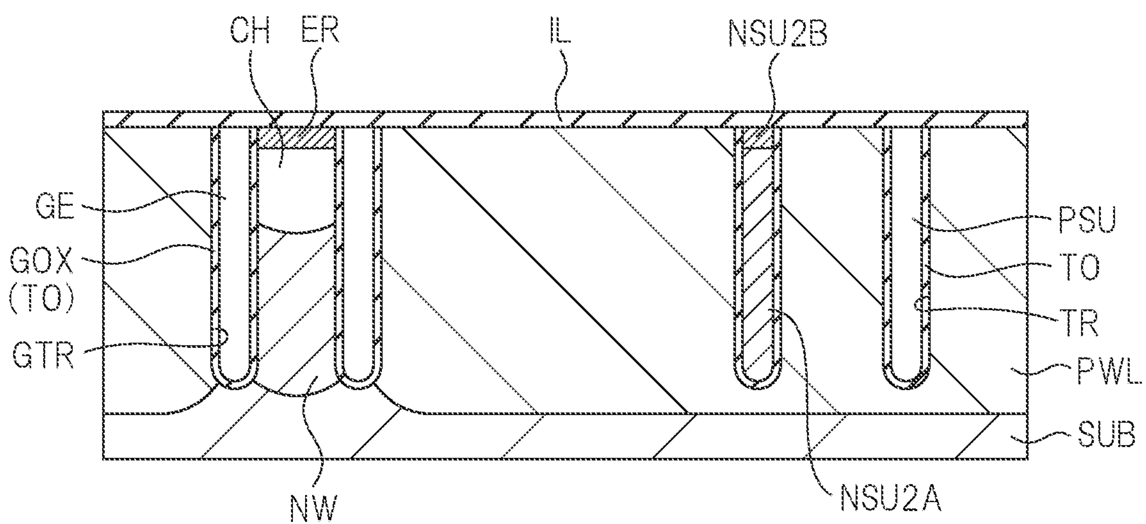
Figure 15B:
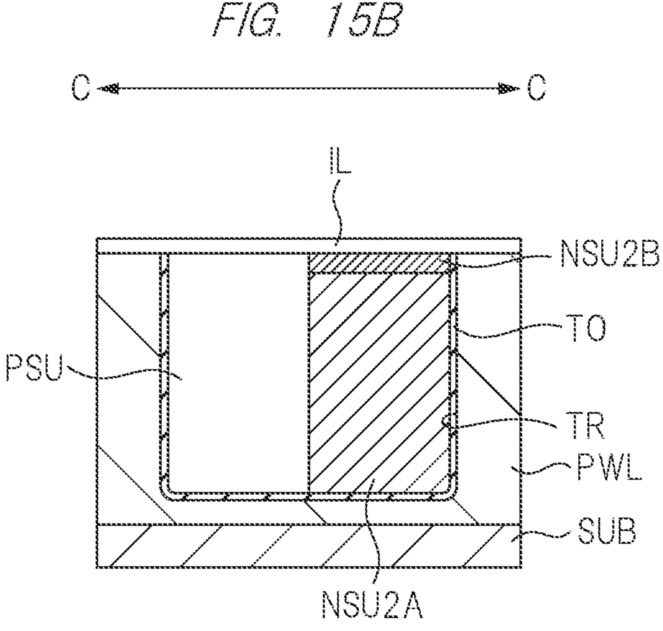

Subsequently, as shown in FIGS. 15A and 15B, an interlayer insulating film IL is formed over from the cell formation region RA to the temperature detection diode formation region RB. The interlayer insulating film IL is made of, for example, a silicon oxide film, and can be formed by using, for example, a CVD method.

Then, as shown in FIGS. 16A and 16B, a contact hole CNT penetrating through the interlayer insulating film IL is formed by using the photolithography technique and the etching technique. Particularly, a contact hole CNT3 penetrating through the interlayer insulating film IL and the emitter region ER to reach the channel layer CH is formed in the cell formation region RA. Meanwhile, a contact hole CNT1 penetrating through the interlayer insulating film IL to reach the n-type semiconductor portion NSU2B, and a contact hole CNT2 penetrating the interlayer insulating film IL to reach the p-type semiconductor portion PSU are formed in the temperature detection diode formation region RB. Thereafter, by using the photolithography technique and the ion implantation method, boron is introduced into the bottom of the contact hole CNT to form the p-type back gate layer PB.

Next, as shown in FIGS. 17A and 17B, a tungsten film is formed on the interlayer insulating film IL in which the contact hole CNT is formed. The tungsten film can be formed by using, for example, a CVD method. At this time, the tungsten film is not only formed on the front surface of the interlayer insulating film IL but also embedded in the contact hole CNT. Thereafter, for example, by using a CMP (Chemical Mechanical Polishing) method, the unnecessary tungsten film formed on the front surface of the interlayer insulating film IL is removed, while a plug PLG is formed by leaving the tungsten film embedded in the contact hole CNT. Particularly, in the cell formation region RA, a plug PLG3 electrically connected to the emitter region ER and the channel layer CH is formed. In contrast, in the temperature detection diode formation region RB, a plug PLG1 electrically connected to the n-type semiconductor portion NSU2B and a plug PLG2 electrically connected to the p-type semiconductor portion PSU are formed.

Figure 18A:
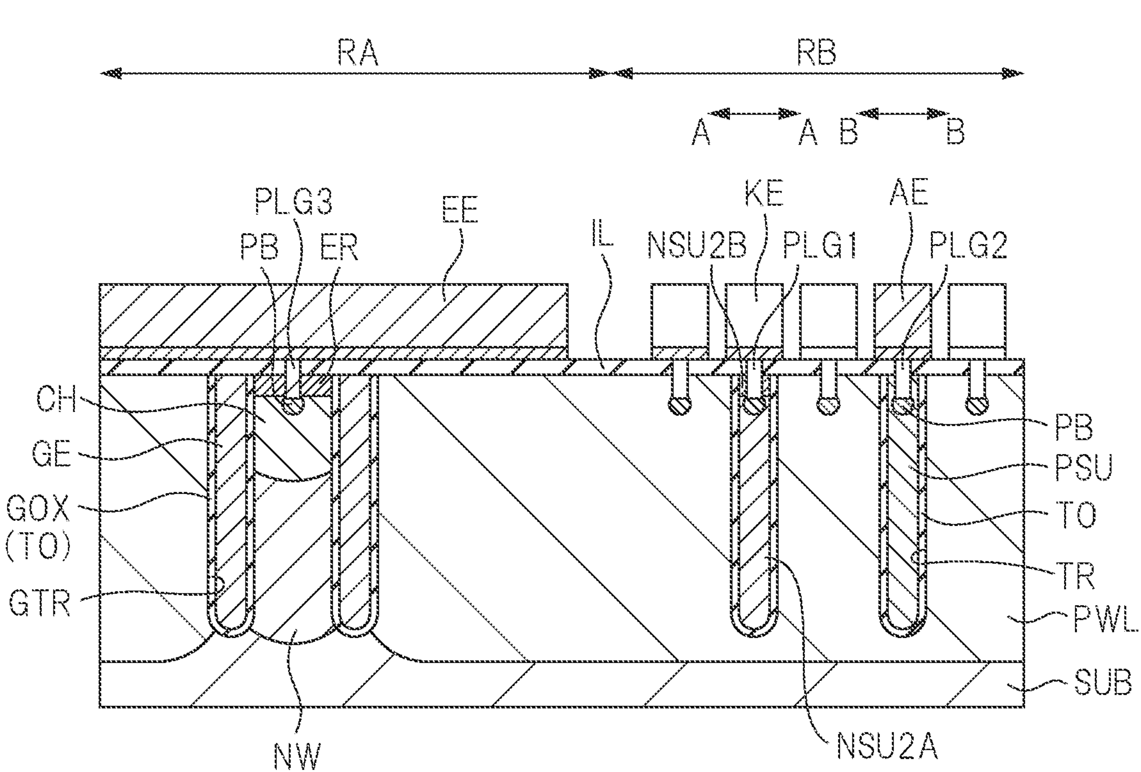
FIGS. 18A and 18B are diagrams each showing a manufacturing process following FIG. 17.
Figure 18B:
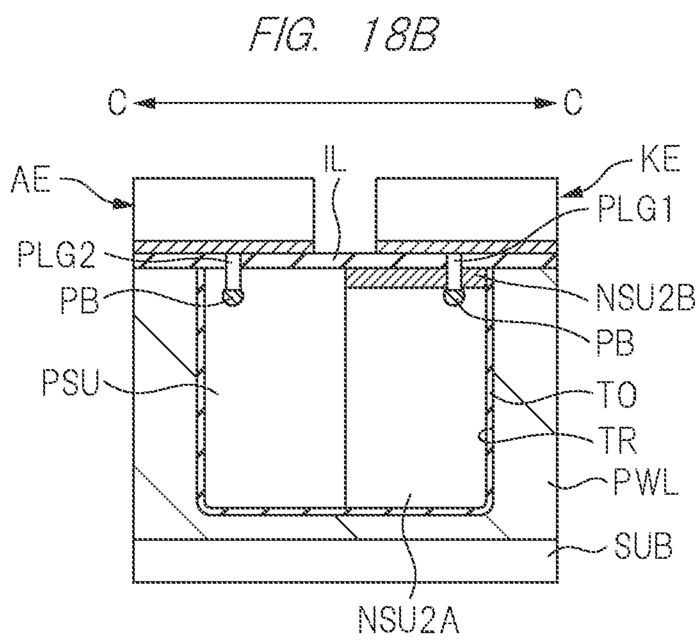

Subsequently, as shown in FIGS. 18A and 18B, a laminated film made of a titanium tungsten film (TiW film) and an aluminum film (Al film) is formed on the interlayer insulating film IL in which the plug PLG is formed. Each of the titanium tungsten film and the aluminum film can be formed by using, for example, a sputtering method. Thereafter, the laminated film of the titanium tungsten film (TiW film) and the aluminum film (Al film) is patterned by using the photolithography technique and the etching technique. This makes it possible to form, for example, an emitter electrode EE electrically connected to the plug PLG3 in the cell formation region RA. Meanwhile, in the temperature detection diode formation region RB, a cathode electrode KE electrically connected to the plug PLG1 and an anode electrode AE electrically connected to the plug PLG2 can be formed.

Figure 19A:
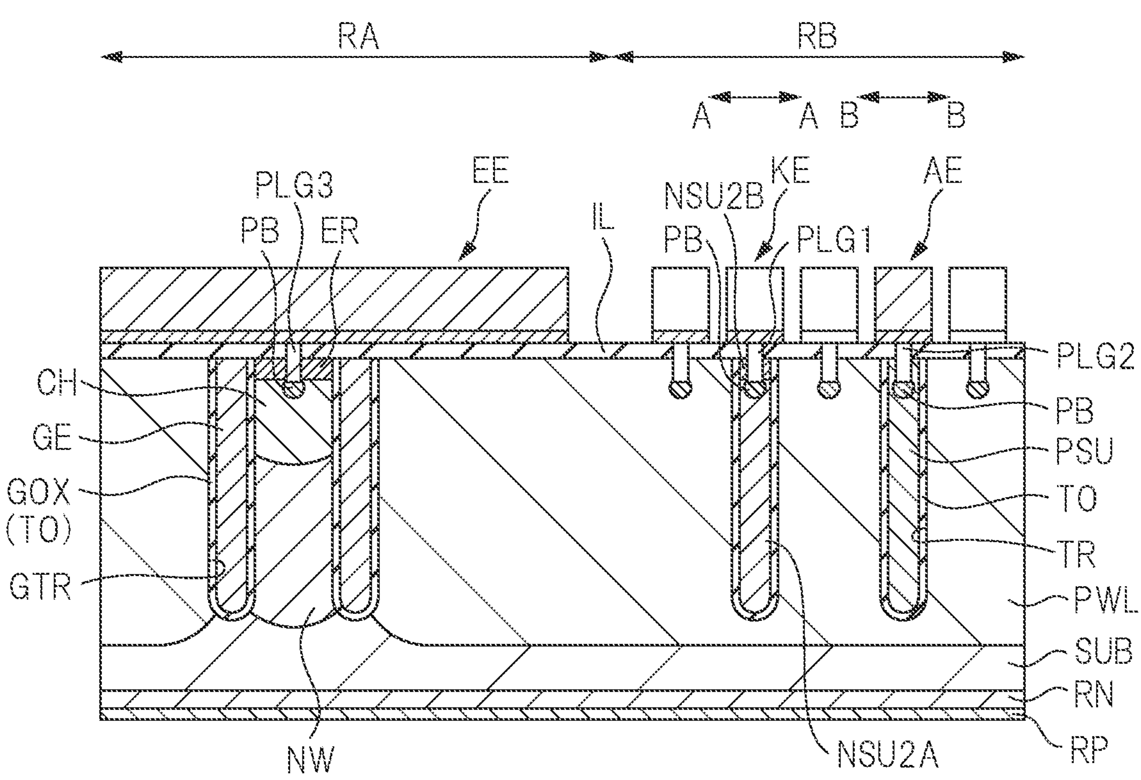
FIGS. 19A and 19B are diagrams each showing a manufacturing process following FIG. 18.
Figure 19B:
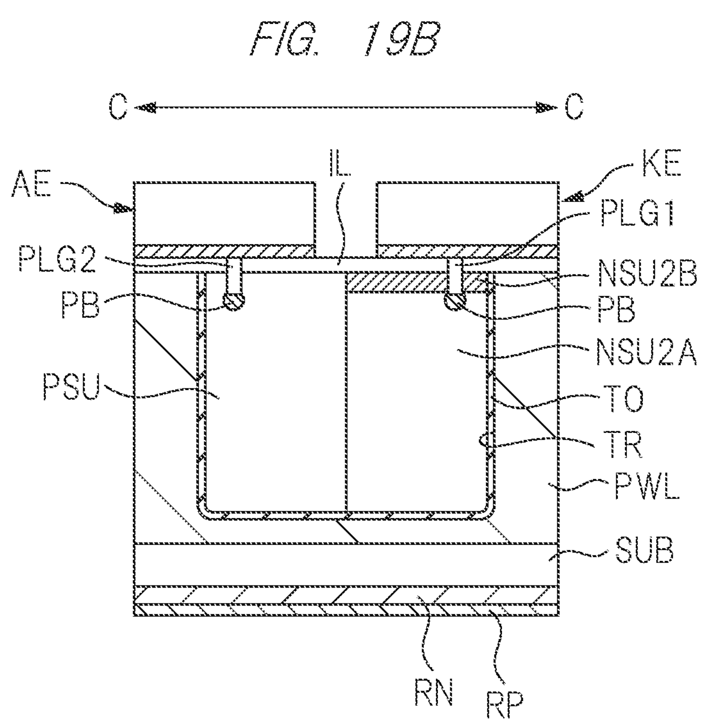

Next, as shown in FIGS. 19A and 19B, after the backside n-type buffer layer RN is formed on a back surface of the semiconductor substrate SUB, a backside p-type layer RP contacting with the backside n-type buffer layer RN is formed. As described above, the semiconductor device including the temperature detection diode of "Type 2" and the trench gate type IGBT can be manufactured.

Features of Manufacturing Method of First Embodiment

Subsequently, a feature point of a manufacturing method of the first embodiment will be described.

A first feature point of a manufacturing method of the first embodiment is that the temperature detection diode is formed in the trench TR and, as a result, even if the temperature detection diode is formed as an optional element in addition to the trench gate type IGBT, the flatness of the front surface of the interlayer insulating film IL in which the contact hole CNT is formed can be enhanced, for example as shown in FIGS. 16A and 16B. Consequently, removing the unnecessary tungsten film formed on the front surface of the interlayer insulating film IL by a CMP method becomes easier after forming the tungsten film on the interlayer insulating film IL in which the contact hole CNT is formed.

That is, according to the first embodiment, even when the temperature detection diode is formed also as the optional element, the occurrence of the step on the interlayer insulating film can be suppressed resulting in that the complication and the increased difficulty in the manufacturing process caused by the step can be avoided. In particular, when a CMP method is used in a plug forming process in FIG. 16 and FIG. 17, according to the first embodiment in which the flatness of the front surface of the interlayer insulting film IL is improved, "polishing residue" of the tungsten film caused by the step can be suppressed and, as a result, reliability of the plug forming process by a CMP method can be improved.

Next, a second feature point of the manufacturing method is, for example as shown in figures subsequent to FIGS. 8A and 8B, using only the polysilicon film PF to manufacture the trench gate type IGBT and the temperature detection diode. This is a feature point of being realizable by adopting the configuration of the first embodiment in which the temperature detection diode is formed in the trench TR.

For example, when the configuration in which the temperature detection diode is formed in the trench TR is not adopted, it becomes necessary that a polysilicon film separate from the polysilicon film PF embedded in the gate trench of the trench gate type IGBT is formed on the semiconductor substrate and the temperature detection diode is formed in this polysilicon film. In this case, not only the step occurs on the interlayer insulating film but also the number of processes of forming the polysilicon film is increased. Then, the increase in the number of processes of forming the polysilicon film means an increase in manufacturing cost of the semiconductor device including the trench gate type IGBT and the temperature detection diode. Regarding this point, according to the second feature point of the first embodiment, the temperature detection diode can be formed by using the polysilicon film PF embedded in the gate trench of the trench gate type IGBT. Namely, according to the second feature point, even in the semiconductor device providing the temperature detection diode together with the trench gate type IGBT, the number of processes of forming the polysilicon film for forming the gate electrode of the trench gate type IGBT and the temperature detection diode can be suppressed at one and, as a result, the advantage of reducing the manufacturing cost of the semiconductor device including the trench gate type IGBT and the temperature detection diode can be obtained.

Subsequently, a third feature point of the manufacturing method is that, for example as shown in FIGS. 11A and 11B, the process of forming the gate electrode GE in the gate trench GTR and the process of forming the n-type semiconductor portion NSU2A and the p-type semiconductor portion PSU in the trench TR are performed not in the separate processes but in the same process. Further, the third feature point of the manufacturing method is in that, for example as shown in FIGS. 14A and 14B, the process of forming the emitter region ER and the process of forming the n-type semiconductor portion NSU2B are performed not in the separate processes but in the same process.

This makes it possible to simplify, according to the third feature point, the manufacturing process of the semiconductor device including the trench gate type IGBT and the temperature detection diode. As a result, the third feature point makes it possible to reduce the manufacturing cost of the semiconductor device including the trench gate type IGBT and the temperature detection diode. As described above, the manufacturing method of the semiconductor device according to the first embodiment having the first to third feature points has great technical significance in that the technical idea of being capable of not only the improvement in the flatness but also the reduction in the manufacturing cost of the semiconductor device is provided.

Second Embodiment

In a second embodiment, an example in which the basic idea is embodied as a gate protection diode will be described.

Configuration of Gate Protection Diode

Although a cross-sectional structure of a gate protection diode 30 will be described below, there are two types of cross-sectional structures of the gate protection diode 30 in the second embodiment. Therefore, a first type of cross-sectional structure of the gate protection diode 30 is called "Type 1", a second type of cross-sectional structure of the gate protection diode 30 is called "Type 2", and each will be described.

Structure of "Type 1"

Figure 20:
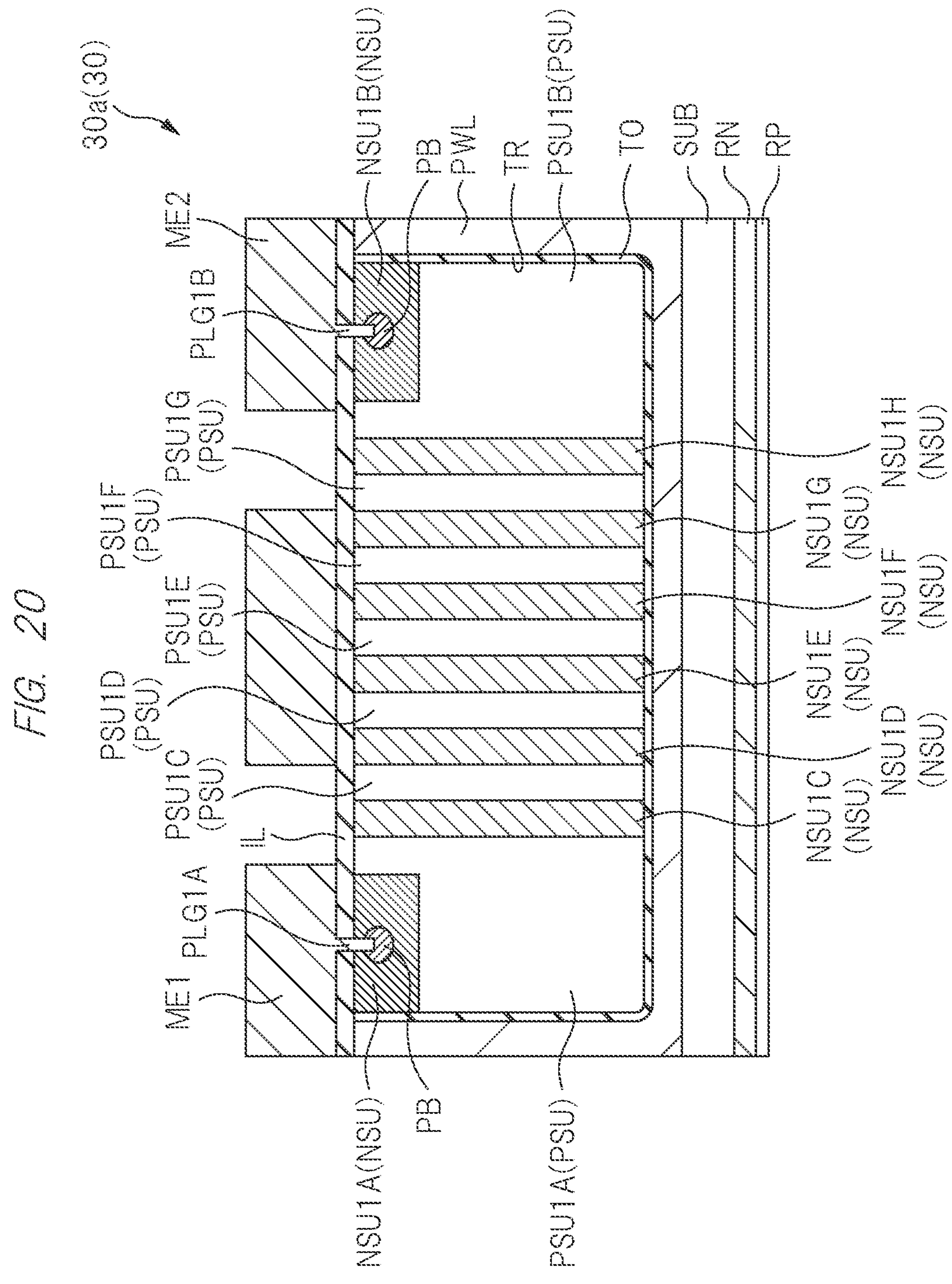
FIG. 20 is a diagram showing a cross-sectional structure of a "Type 1" of gate protection diode.

FIG. 20 is a diagram showing a cross-sectional structure of a gate protection diode 30*a* of "Type 1".

Here, the semiconductor substrate SUB has the element formation region, and a gate protection diode 30*a* shown in FIG. 20 is formed in part of this element formation region.

Meanwhile, although not shown in FIG. 20, the power transistor is formed in the element formation region of the semiconductor substrate SUB in addition to the gate protection diode 30*a*. Then, the power transistor is configured of, for example, the trench gate type IGBT.

In FIG. 20, the backside n-type buffer layer RN for suppressing extension of a depletion layer and the backside p-type layer RP to which the collector potential is supplied are provided on the back surface of the semiconductor substrate SUB made of, for example, a silicon substrate. Meanwhile, the p-type layer PWL to which the emitter potential is supplied is provided on the front surface of the semiconductor substrate SUB. That is, the p-type layer PWL is connected to the emitter potential of the trench gate type IGBT.

As shown in FIG. 20, the trench TR is provided in the p-type layer PWL. The insulating film TO made of, for example, a silicon oxide film is formed on the inner wall of the trench TR. Then, the p-type semiconductor portion PSU and the n-type semiconductor portion NSU are embedded in the trench TR. In this case, the p-type semiconductor portion PSU and the n-type semiconductor portion NSU contact with each other. As a result, the pn junction is formed in the contact region between the p-type semiconductor portion PSU and the n-type semiconductor portion NSU. Thus, the p-type semiconductor portion PSU and the n-type semiconductor portion NSU form the pn junction diode. This pn junction diode functions as the gate protection diode 30*a*. That is, the gate protection diode 30*a* in the second embodiment is configured of the p-type semiconductor portion PSU embedded in the trench TR and the n-type semiconductor portion NSU embedded in the trench TR. Here, the p-type semiconductor portion PSU is configured of, for example, a polysilicon film into which boron is introduced as an acceptor. In contrast, the n-type semiconductor portion NSU is configured of, for example, a polysilicon film into which arsenic or phosphorus is introduced as a donor.

The cross-sectional structure of the gate protection diode 30*a* will be specifically described below.

In FIG. 20, a p-type semiconductor portion PSU1A and a n-type semiconductor portion NSU1A are embedded in a part of the trench TR via the insulating film TO. In this case, the n-type semiconductor portion NSU1A is provided on the p-type semiconductor portion PSU1A. Arsenic as a donor is introduced into this n-type semiconductor portion NSU1A. Meanwhile, boron as an acceptor is introduced into the p-type semiconductor portion PSU1A. Further, in the "Type 1", the plug PLG1A is arranged so as to reach the n-type semiconductor portion NSU1A but not to penetrate through the n-type semiconductor portion NSU1A, and the p-type back gate layer PB is provided at a bottom of the plug PLG1A. The plug PLG1A penetrates through the interlayer insulating film IL formed on the trench TR, and is electrically connected to a metal electrode ME1 formed on the interlayer insulating film IL. Consequently, the n-type semiconductor portion NSU1A is electrically connected to the metal electrode ME1 via the plug PLG1A. Then, this metal electrode ME1 is electrically connected to, for example, the gate electrode of the trench gate type IGBT. Therefore, the n-type semiconductor portion NSU1A is electrically connected to the gate electrode of the trench gate type IGBT.

Similarly, a p-type semiconductor portion PSU1B and an n-type semiconductor portion NSU1B are embedded in a part of the trench TR via the insulating film TO. In this case, the n-type semiconductor portion NSU1B is provided on and above the p-type semiconductor portion PSU1B. Arsenic as a donor is introduced into this n-type semiconductor portion NSU1B. Meanwhile, boron as an acceptor is introduced into the p-type semiconductor portion PSU1B. Further, in the "Type 1", the plug PLG1B is arranged so as to reach the n-type semiconductor portion NSU1B but not to penetrate through the n-type semiconductor portion NSU1B, and the p-type back gate layer PB is provided at a bottom of the plug PLG1B. The plug PLG1B penetrates through the interlayer insulating film IL formed on the trench TR and is electrically connected to a metal electrode ME2 formed on the interlayer insulating film IL. Consequently, the n-type semiconductor portion NSU1B is electrically connected to the metal electrode ME2 via the plug PLG1B. Then, this metal electrode ME2 is electrically connected to, for example, the emitter region of the trench gate type IGBT. Therefore, the n-type semiconductor portion NSU1B is electrically connected to the emitter region of the trench gate type IGBT.

Subsequently, as shown in FIG. 20, a plurality of n-type semiconductor portions NSU and a plurality of p-type semiconductor portions PSU are provided between the p-type semiconductor portion PSU1A and the p-type semiconductor portion PSU1B in the trench TR. Specifically, an n-type semiconductor portion NSU1C is provided so as to contact with the p-type semiconductor portion PSU1A, and a p-type semiconductor portion PSU1C is provided so as to contact with this n-type semiconductor portion NSU1C. Similarly, an n-type semiconductor portion NSU1D is provided so as to contact with the p-type semiconductor portion PSU1C, and a p-type semiconductor portion PSU1D is provided so as to contact with this n-type semiconductor portion NSU1D. Further, an n-type semiconductor portion NSU1E is provided so as to contact with the p-type semiconductor portion PSU1D, and a p-type semiconductor portion PSU1E is provided so as to contact with this n-type semiconductor portion NSU1E. Then, an n-type semiconductor portion NSU1F is provided so as to contact with the p-type semiconductor portion PSU1E, and a p-type semiconductor portion PSU1F is provided so as to contact with this n-type semiconductor portion NSU1F. Furthermore, an n-type semiconductor portion NSU1G is provided so as to contact with the p-type semiconductor portion PSU1F, and a p-type semiconductor portion PSU1G is provided so as to contact with this n-type semiconductor portion NSU1G. Moreover, an n-type semiconductor portion NSU1H is provided so as to contact with the p-type semiconductor portion PSU1G, and this n-type semiconductor portion NSU1H is provided so as to contact with the p-type semiconductor portion PSU1B.

Namely, in the trench TR and between the p-type semiconductor portion PSU1A and the p-type semiconductor portion PSU1B, one p-type semiconductor portion PSU among the plurality of p-type semiconductor portions PSU is arranged between the two n-type semiconductor portions NSU among the plurality of n-type semiconductor portions NSU. Further, in the trench TR and between the p-type semiconductor portion PSU1A and the p-type semiconductor portion PSU1B, one n-type semiconductor portion NSU among the plurality of n-type semiconductor portions NSU is arranged between the two p-type semiconductor portions PSU among the plurality of p-type semiconductor portions PSU. The n-type semiconductor portion NSU contacting with the p-type semiconductor portion PSU1A is arranged between the p-type semiconductor portion PSU1A and one p-type semiconductor portion PSU among the plurality of p-type semiconductor portions PSU. The n-type semiconductor portion NSU contacting with the p-type semiconductor portion PSU1B is arranged between the p-type semiconductor portion PSU1B and one p-type semiconductor portion PSU among the plurality of p-type semiconductor portions PSU.

Here, phosphorus as a donor is introduced into each of the n-type semiconductor portions NSU1C to NSU1H. Meanwhile, boron as an acceptor is introduced into each of the p-type semiconductor portions PSU1C to PSU1G.

As described above, in the "Type 1", the plurality of p-type semiconductor portions PSU and the plurality of n-type semiconductor portions NSU are embedded in the trench TR, and the p-type semiconductor portions PSU and the n-type semiconductor portions NSU are arranged alternately. As a result, in the "Type 1", a plurality of pn junction diodes connected in anti-series is formed in the trench TR, and the plurality of pn junction diodes connected in anti-series function as the gate protection diode 30*a*. Then, the n-type semiconductor portion NSU1A is electrically connected to the gate electrode of the trench gate type IGBT, while the n-type semiconductor portion NSU1B is electrically connected to the emitter region of the trench gate type IGBT. For this reason, the gate protection diode 30*a* is provided between the gate electrode of the trench gate type IGBT and the emitter region.

Structure of "Type 2"

Figure 21:
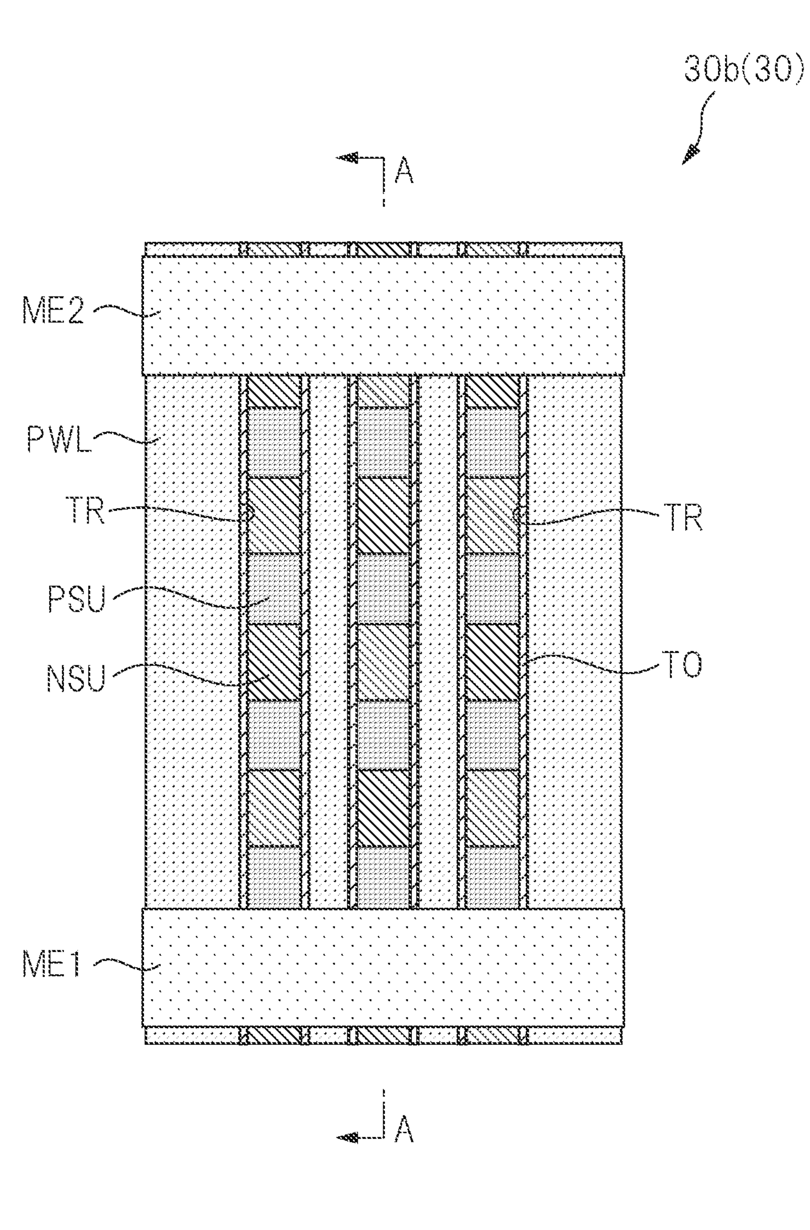
FIG. 21 is a top view of a "Type 2" of gate protection diode.

FIG. 21 is a top view of a gate protection diode 30*b*. In FIG. 21, the plurality of trenches TR is provided in the p-type layer PWL. Specifically, the plurality of trenches TR is arranged alongside in the X direction, and each of the plurality of trenches TR extends in the Y direction. Then, the plurality of p-type semiconductor portions PSU and the plurality of n-type semiconductor portions NSU are embedded in the plurality of trenches TR. Specifically, as shown in FIG. 21, the n-type semiconductor portions NSU and the p-type semiconductor portions PSU are alternately arranged along the Y direction in the plurality of trenches TR. In this case, in FIG. 21, the metal electrode ME1 extending in the X direction and the metal electrode ME2 extending in the X direction are arranged above the plurality of trenches TR so as to cross the plurality of trenches TR extending in the Y direction. Incidentally, although not shown in FIG. 21, the metal electrode ME1 is electrically connected to, for example, the gate electrode of the trench gate type IGBT. Meanwhile, the metal electrode ME2 is electrically connected to, for example, the emitter region of the trench gate type IGBT.

Figure 22:
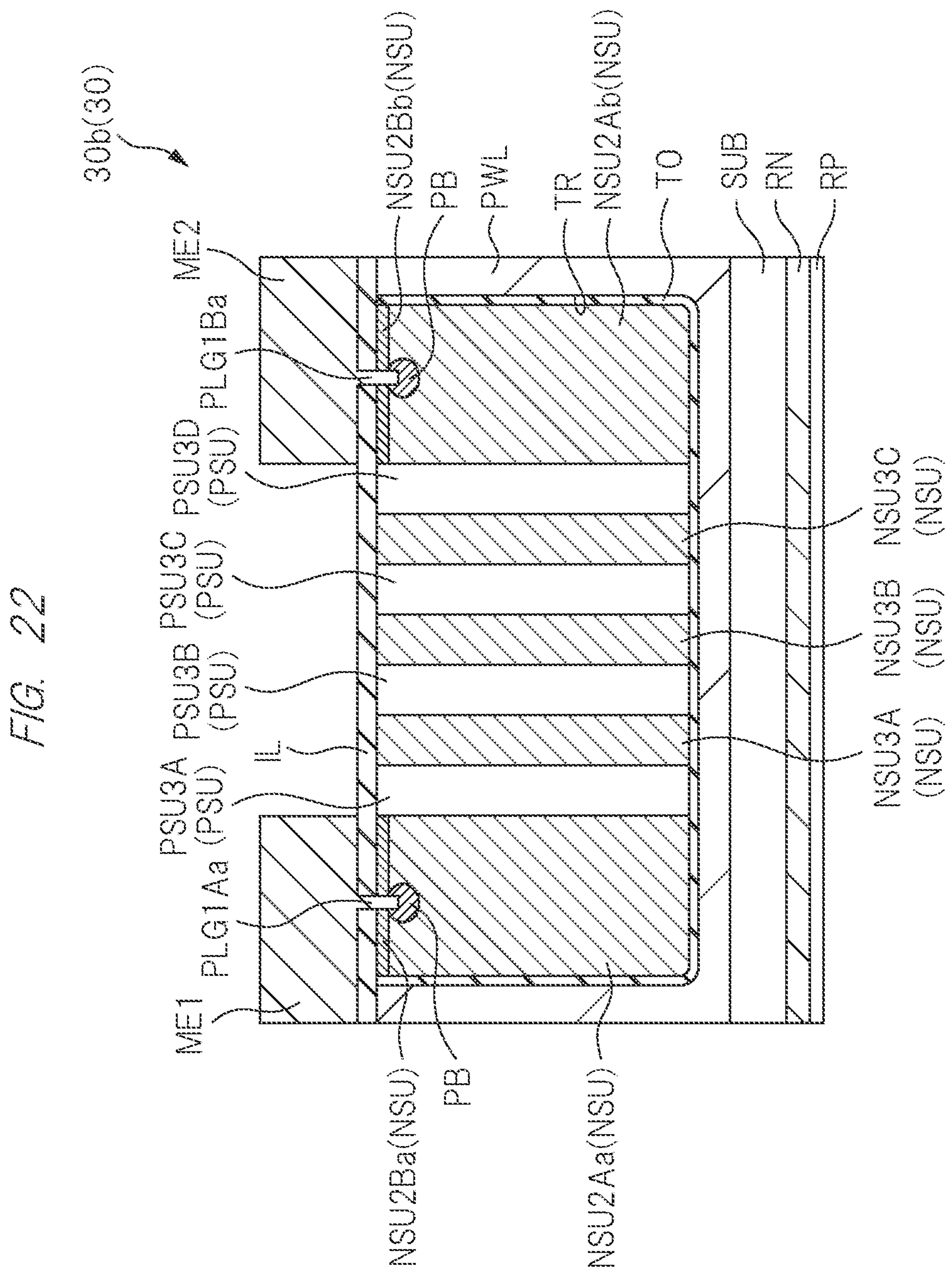
FIG. 22 is a sectional view of the "Type 2" of gate protection diode along line A-A in FIG. 21.

Next, FIG. 22 is a sectional view along line A-A in FIG. 21, and is a diagram showing a cross-sectional structure of a gate protection diode 30*b* of "Type 2".

As shown in FIG. 22, the trench TR is provided in the p-type layer PWL. The insulating film TO made of, for example, a silicon oxide film is formed on the inner wall of the trench TR. Then, the p-type semiconductor portion PSU and the n-type semiconductor portion NSU are embedded in the trench TR. In this case, the p-type semiconductor portion PSU and the n-type semiconductor portion NSU contact with each other. As a result, the pn junction is formed in the contact region between the p-type semiconductor portion PSU and the n-type semiconductor portion NSU. Thus, the p-type semiconductor portion PSU and the n-type semiconductor portion NSU form the pn junction diode. This pn junction diode functions as a gate protection diode 30*b*. That is, the gate protection diode 30*b* in the second embodiment is configured of the p-type semiconductor portion PSU embedded in the trench TR and the n-type semiconductor portion NSU embedded in the trench TR. Here, the p-type semiconductor portion PSU is made of, for example, a polysilicon film into which boron is introduced as an acceptor. In contrast, the n-type semiconductor portion NSU is made of, for example, a polysilicon film into which arsenic or phosphorus is introduced as a donor.

The cross-sectional structure of the gate protection diode 30*b* will be specifically described below.

In FIG. 22, an n-type semiconductor portion NSU2Aa and an n-type semiconductor portion PSU2Ba are embedded in a part of the trench TR via the insulating film TO. In this case, the n-type semiconductor portion NSU2Ba is provided on and above the n-type semiconductor portion NSU2Aa. Phosphorus as a donor is introduced into this n-type semiconductor portion NSU2Aa. Meanwhile, arsenic as a donor is introduced into the n-type semiconductor portion NSU2Ba. Further, in the "Type 2", the plug PLG1Aa is arranged so as to penetrate through the n-type semiconductor portion NSU2Ba and to reach the n-type semiconductor portion NSU2Aa, and the p-type back gate layer PB is provided at a bottom of the plug PLG1Aa. The plug PLG1Aa penetrates through the interlayer insulating film IL formed on the trench TR, and is electrically connected to the metal electrode ME1 formed on the interlayer insulating film IL. Consequently, the n-type semiconductor portion NSU2Aa and the n-type semiconductor portion NSU2Ba are electrically connected to the metal electrode ME1 via the plug PLG1Aa. Then, this metal electrode ME1 is electrically connected to, for example, the gate electrode of the trench gate type IGBT. Therefore, the n-type semiconductor portion NSU2Aa and the n-type semiconductor portion NSU2Ba are electrically connected to the gate electrode of the trench gate type IGBT.

Similarly, an n-type semiconductor portion NSU2Ab and an n-type semiconductor portion PSU2Bb are embedded in a part of the trench TR via the insulating film TO. In this case, the n-type semiconductor portion NSU2Bb is provided on and above the n-type semiconductor portion NSU2Ab. Phosphorus as a donor is introduced into this n-type semiconductor portion NSU2Ab. Meanwhile, arsenic as a donor is introduced into the n-type semiconductor portion NSU2Bb. Further, in the "Type 2", the plug PLG1Ba is arranged so as to penetrate through the n-type semiconductor portion NSU2Bb and to reach the n-type semiconductor portion NSU2Ab, and the p-type back gate layer PB is provided at a bottom of the plug PLG1Ba. The plug PLG1Ba penetrates through the interlayer insulating film IL formed on the trench TR, and is electrically connected to the metal electrode ME2 formed on the interlayer insulating film IL. Consequently, the n-type semiconductor portion NSU2Ab and the n-type semiconductor portion NSU2Bb are electrically connected to the metal electrode ME2 via the plug PLG1Ba. Then, this metal electrode ME2 is electrically connected to, for example, the emitter region of the trench gate type IGBT. Therefore, the n-type semiconductor portion NSU2Ab and the n-type semiconductor portion NSU2Bb are electrically connected to the emitter region of the trench gate type IGBT.

Subsequently, as shown in FIG. 22, a plurality of n-type semiconductor portions NSU and a plurality of p-type semiconductor portions PSU are formed between the n-type semiconductor portion NSU2Aa and the n-type semiconductor portion NSU2Ab in the trench TR. Specifically, a p-type semiconductor portion PSU3A is provided so as to contact with the n-type semiconductor portion NSU2Aa, and an n-type semiconductor portion NSU3A is provided so as to contact with this p-type semiconductor portion PSU3A. Similarly, a p-type semiconductor portion PSU3B is provided so as to contact with the n-type semiconductor portion NSU3A, and an n-type semiconductor portion NSU3B is provided so as to contact with this p-type semiconductor portion PSU3B. Also, a p-type semiconductor portion PSU3C is provided so as to contact with the n-type semiconductor portion NSU3B, and an n-type semiconductor portion NSU3C is provided so as to contact with this p-type semiconductor portion PSU3C. Then, a p-type semiconductor portion PSU3D is provided so as to contact with the n-type semiconductor portion NSU3C, and this p-type semiconductor portion PSU3D is provided so as to contact with the n-type semiconductor portion NSU2Ab.

Namely, in the trench TR and between the n-type semiconductor portion NSU2Aa and the n-type semiconductor portion NSU2Ab, one p-type semiconductor portion PSU among the plurality of p-type semiconductor portions PSU is arranged between the two n-type semiconductor portions NSU among the plurality of n-type semiconductor portions NSU. Further, in the trench TR and between the n-type semiconductor portion NSU2Aa and the n-type semiconductor portion NSU2Ab, one n-type semiconductor portion NSU among the plurality of n-type semiconductor portions NSU is arranged between the two p-type semiconductor portions PSU among the plurality of p-type semiconductor portions PSU. The p-type semiconductor portion PSU contacting with the n-type semiconductor portion NSU2Aa is arranged between the n-type semiconductor portion NSU2Aa and one n-type semiconductor portion NSU among the plurality of n-type semiconductor portions NSU. The p-type semiconductor portion PSU contacting with the n-type semiconductor portion NSU2Ab is arranged between the n-type semiconductor portion NSU2Ab and one n-type semiconductor portion NSU among the plurality of n-type semiconductor portions NSU.

Here, phosphorus as a donor is introduced into each of the n-type semiconductor portions NSU3A to NSU3C. Meanwhile, boron as an acceptor is introduced into each of the p-type semiconductor portions PSU3A to PSU3D.

As described above, also in the "Type 2", the plurality of p-type semiconductor portions PSU and the plurality of n-type semiconductor portions NSU are embedded in the trench TR, and the p-type semiconductor portions PSU and the n-type semiconductor portions NSU are arranged alternately. As a result, also in the "Type 2", the plurality of pn junction diodes connected in anti-series is formed in the trenches TR, and the plurality of pn junction diodes connected in anti-series functions as the gate protection diode 30*b*. Then, the n-type semiconductor portion NSU2Aa and the n-type semiconductor portion NSU2Ba are electrically connected to the gate electrode of the trench gate type IGBT, while the n-type semiconductor portion NSU2Ab and the n-type semiconductor portion NSU2Bb are electrically connected to the emitter region of the trench gate type IGBT. From this reason, the gate protection diode 30*b* is provided between the gate electrode and the emitter region of the trench gate type IGBT.

Structural Features of Second Embodiment

Next, structural features of the second embodiment will be described. A structural feature point of the second embodiment is in that, for example as shown in FIGS. 20 to 22, the gate protection diode 30 is provided in the trench TR. Namely, in the second embodiment, there is a structural feature point in that the trenches are formed in the semiconductor substrate and the plurality of p-type semiconductor portions and the plurality of n-type semiconductor portions are alternately provided in the trenches via the insulating film, which form the gate protection diode 30 in the trenches TR. Then, according to this feature point, as a result of eliminating the cause of the step of forming the gate protection diode by using the polysilicon film formed on the semiconductor substrate, the flatness of the semiconductor device including the trench gate type IGBT and the gate protection diode 30 can be enhanced.

Manufacturing Method of Semiconductor Device

In the second embodiment, by using the manufacturing method of the semiconductor device in the first embodiment, the semiconductor device including the trench gate type IGBT and the gate protection diode can be manufactured. For example, by changing a patterning process represented by patterning or the like of the resist film PR1 shown in FIGS. 10A and 10B, the semiconductor device of the second embodiment can be manufactured.

Advantages common to "Types 1" of First Embodiment and Second Embodiment

For example, in the pn junction diode that configures the temperature detection diode and the gate protection diode, a current flowing through the pn junction diode is determined by a pn junction area of the pn junction diode. Regarding this point, in the "Type 1" of the first embodiment, as shown in FIG. 5C, the pn junction area is determined by a layout of the n-type semiconductor portion NSU1 formed on the front surface, does not depend on a depth of the trench TR. In contrast, in the "Type 2" of the first embodiment, the pn junction area depends on the depth of the trench TR, as shown in FIG. 6C.

Similarly, also in the "Type 1" of the second embodiment, as shown in FIG. 20, the pn junction area is basically determined by a layout of the n-type semiconductor portion NSU1A and the n-type semiconductor portion NSU1B, does not depend on the depth of the trench TR. Meanwhile, in the "Type 2" of the second embodiment, as shown in FIG. 22, the pn junction area depends on the depth of the trench TR.

Here, generally, layout variation (exposure variation in photolithography technique) is smaller than depth variation of the trench TR. Therefore, according to the "Type 1", the advantage of being able to reduce current variation of the pn junction diode is obtained. That is, according to the "Type 1", the advantage that the current variation is small and current design of the diode is easy can be obtained.

Further Devisal Point common to Frist and Second Embodiments

Subsequently, further devisal points common to the first embodiment and the second embodiment will be described. This devisal point is in that, for example as shown in FIG. 3, the plug PLG3 connected to the emitter potential of the trench gate type IGBT is formed between the trenches TR next to each other. This makes it possible to extract holes from the p-type layer PWL via the plug PLG3.

A technical significance of providing the plug PLG3 will be described below.

Figure 23:
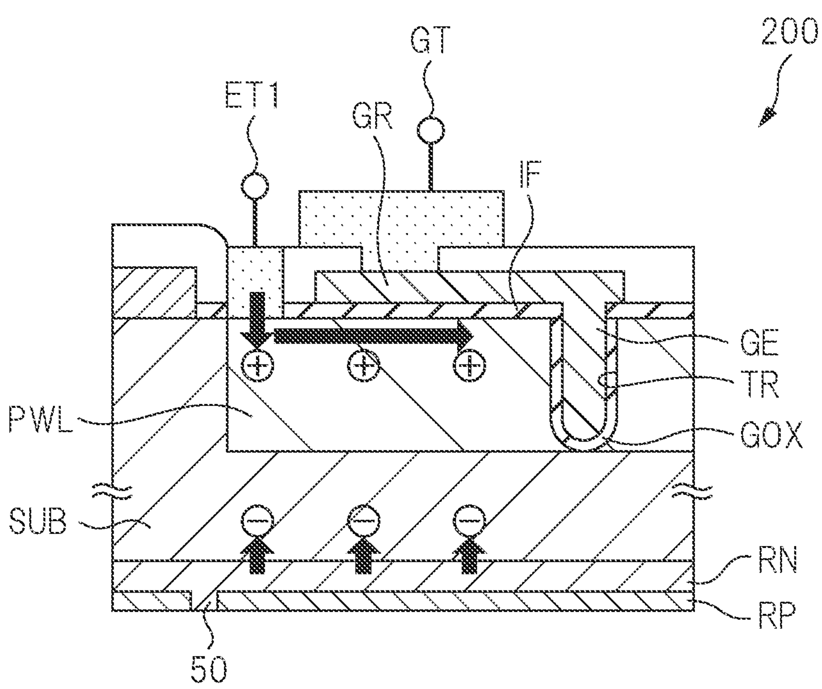
FIG. 23 is a diagram for explaining a mechanism of occurrence of dielectric breakdown of an insulating film.

For example, FIG. 23 is a diagram showing a general trench gate type IGBT 200.

In FIG. 23, a backside n-type buffer layer RN and a backside p-type layer RP to which the collector potential is supplied are provided on the back surface of the semiconductor substrate SUB made of an n-type silicon substrate. Meanwhile, the p-type layer PWL to which the emitter potential is supplied is provided on the front surface of the semiconductor substrate SUB. That is, the p-type layer PWL is electrically connected to the emitter terminal ET1 of the trench gate type IGBT. Then, the trench TR is provided in the p-type layer PWL, and the gate electrode GE is embedded in the trench TR via a gate insulating film GOX.

The insulating film IF is formed on a front surface of the p-type layer PWL, and a gate resistor GR made of, for example, a polysilicon resistor is arranged on the insulating film IF, and the gate resistor GR is connected to the gate electrode GE. Further, the gate resistor GR is electrically connected to the gate terminal GT, and the gate electrode GE is electrically connected to the gate terminal GT via the gate resistor GR.

In the trench gate type IGBT 200 configured in this manner, for example, a scratch or the like may cause a backside defect 50. In this case, the collector potential is applied to the backside n-type buffer layer RN. In the normal trench gate type IGBT 200 in which the backside defect 50 is not present, since the backside p-type layer RP is present, not a parasitic body diode but a parasitic bipolar transistor is present on the trench gate type IGBT 200.

However, as shown in FIG. 23, in the trench gate type IGBT 200 in which the backside defect 50 is present, the trench gate type IGBT functions as a power MOSFET due to the backside defect 50. As a result, a body diode, which is a parasitic diode, is formed in the trench gate type IGBT in which the backside defect 50 is present. Specifically, in FIG. 23, the body diode (pn junction diode) is formed by the semiconductor substrate SUB and the p-type layer PWL. Then, the collector potential is applied to the semiconductor substrate SUB, which is an n-type silicon substrate, via the backside defect 50 and the backside n-type buffer layer RN.

Here, for example, if the trench gate type IGBT 200 is used as a component of the inverter circuit, an ON/OFF operation of the trench gate type IGBT 200 is performed during an operation of the inverter circuit. Then, when a component including inductance such as a motor is connected as a load of the inverter circuit, a counter electromotive force due to the inductance is generated in turning off the trench gate type IGBT 200. That is, when the counter electromotive force is generated, a positive potential is applied to the emitter terminal ET1 of the trench gate type IGBT 200, while a negative potential is applied to the collector of the trench gate type IGBT 200. This means that the positive potential is applied to the p-type layer PWL electrically connected to the emitter terminal ET1 in FIG. 23, while the negative potential is applied to the semiconductor substrate SUB due to the backside defect 50. Namely, a forward voltage is applied to the body diode configured of the semiconductor substrate SUB and the p-type layer PWL. Therefore, when the trench gate type IGBT is turned OFF, the body diode is turned ON and carriers flow into a bulk (semiconductor substrate SUB and p-type layer PWL).

Figure 24:
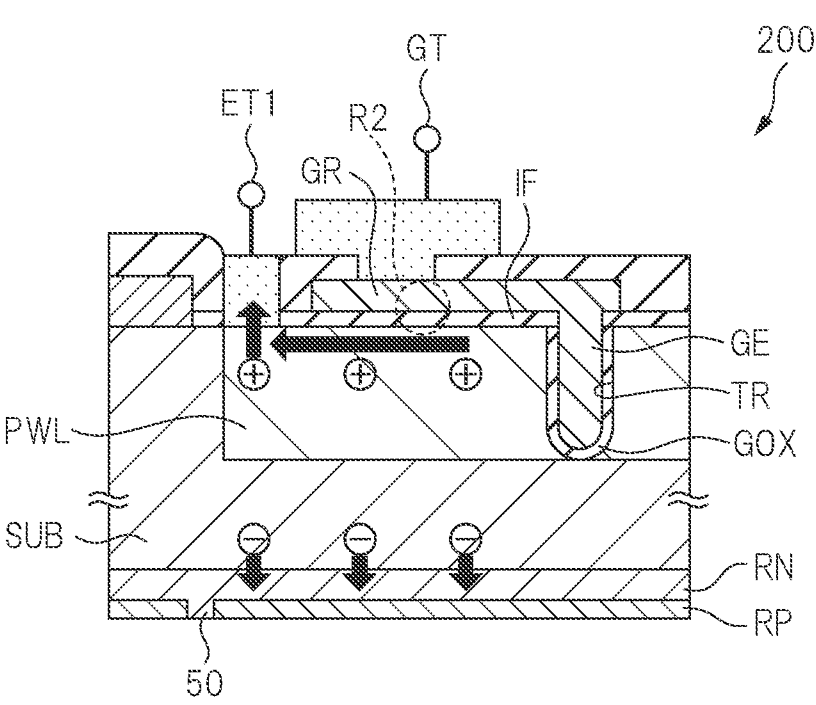
FIG. 24 is a diagram for explaining a mechanism of dielectric breakdown of the insulating film.

Subsequently, when the trench gate type IGBT is turned ON by a switching operation of the trench gate type IGBT, the negative potential is applied to the emitter terminal ET1, while the positive collector potential is applied to the backside n-type buffer layer RN having the backside defect 50. As a result, as shown in FIG. 24, many carriers present in the bulk are discharged. Specifically, holes present in the bulk are swept out to the emitter terminal ET1 to which the negative potential is applied, while electrons present in the bulk are discharged to the collector to which the positive potential is applied.

Figure 25:
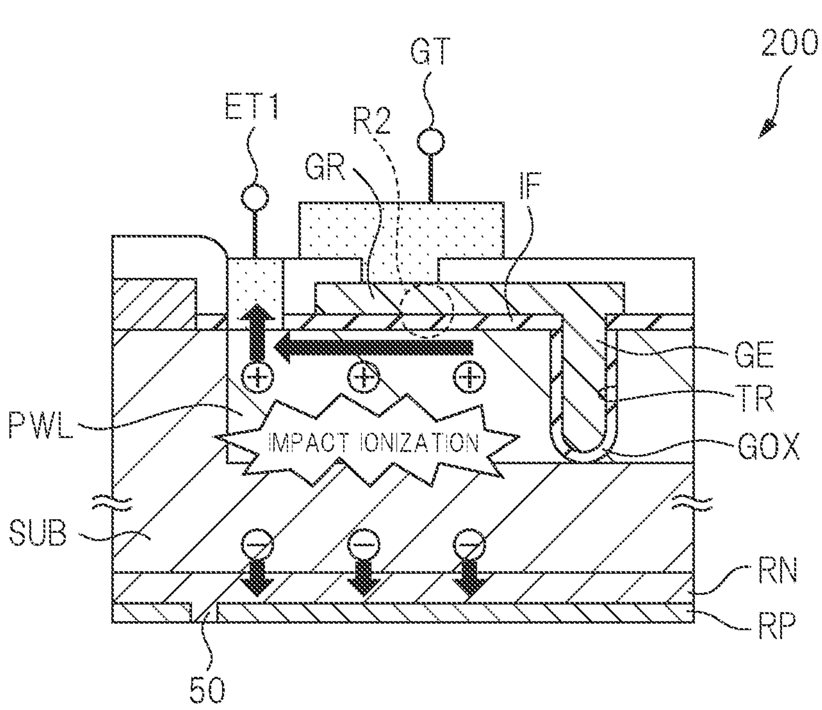
FIG. 25 is a diagram for explaining a mechanism of dielectric breakdown of the insulating film.

In this case, for example, as shown in FIG. 24, in a region R2 located under a region where the gate resistor GR extends (internal region of p-type layer PWL), a high electric field is generated due to a voltage drop generated when holes move. Then, when the positive potential applied to the collector further increases, for example, as shown in FIG. 25, an impact ionization phenomenon occurs in the bulk, thereby generating a large number of carriers. As a result, the voltage drop increases when the holes move, thereby the further higher electric field is generated in the region R2. Consequently, this high electric field causes dielectric breakdown of the insulating film IF located under the gate resistor GR.

In this way, by the mechanism shown in FIGS. 23 to 25, the general trench gate type IGBT 200 may cause a problem of dielectric breakdown of the insulating film IF. That is, due to the gate resistor GR formed on the p-type layer PWL, movement distances of holes to the emitter terminal ET1 becomes longer and, as a result, the higher electric field is generated and the dielectric breakdown of the insulating film IF occurs.

In this regard, on the premise of the first embodiment and the second embodiment, in a semiconductor device in which the gate resistor is also formed in the trench, the plug connected to the emitter potential of the trench gate type IGBT is formed between the trenches next to each other. Then, also in the first embodiment, in the plurality of trenches TR in which the temperature detection diodes 20 are formed, the plug connected to the emitter potential of the trench gate type IGBT is formed between the trenches TR next to each other. Namely, as shown in FIG. 3, the plug PLG3 connected to the emitter potential of the trench gate type IGBT is formed between the trenches TR next to each other. Similarly, in the second embodiment as well, in the plurality of trenches TR in which the gate protection diodes 30 are formed, the plug connected to the emitter potential of the trench gate type IGBT is formed between the trenches TR next to each other.

Figure 26:
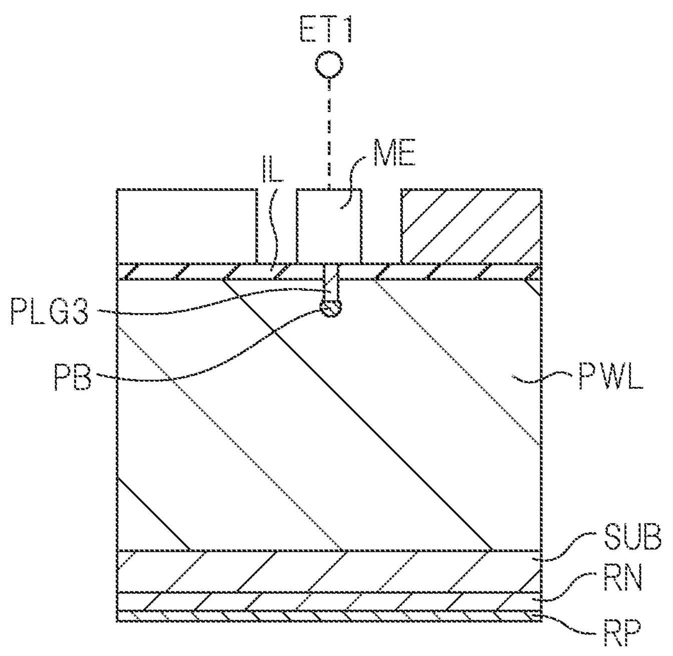
FIG. 26 is a sectional view showing a plug connected to a metal electrode that is electrically connected to an emitter terminal of a trench gate type IGBT.

Specifically, FIG. 26 is a sectional view showing the plug PLG3 connected to the metal electrode ME electrically connected to the emitter terminal ET1 of the trench gate type IGBT. As shown in FIG. 26, the plug PLG3 connected to the metal electrode ME penetrates through the interlayer insulating film IL and is electrically connected to the p-type layer PWL. Then, the plug PLG3 connected to the p-type layer PWL functions, for example, as a discharge port for the carriers accumulated in the bulk. This means that providing a plurality of plugs PLG3 can shorten the movement distance in the bulk when the holes move from an interior of the bulk to the emitter terminal ET1. Consequently, the voltage drop caused by the movement of the holes in the bulk is reduced, and the generation of the high electric field is suppressed. Therefore, according to the first embodiment and the second embodiment, countermeasures are also taken against the dielectric breakdown of the insulating film IF that becomes apparent in the general trench gate type IGBT 200 shown in FIGS. 23 to 25. As a result, the first embodiment and the second embodiment have the technical significance of being able to improve the reliability of the semiconductor device including the trench gate type IGBT and the optional element (temperature detection diode 20 and gate protection diode 30).

Although the invention made by the present inventor(s) has been specifically described based on the embodiments, the invention is not limited to the above embodiments and, needless to say, can be variously modified without departing from the scope of the invention.

What is claimed is:

1. A semiconductor device comprising:

at least one trench formed in an element formation region of a semiconductor substrate;

an insulating film formed on an inner wall of the at least one trench;

at least one p-type semiconductor portion embedded in a part of the at least one trench via the insulating film; and at least one n-type semiconductor portion embedded in another part of the at least one trench via the insulating film and provided so as to contact with the at least one p-type semiconductor portion, wherein the semiconductor substrate is a silicon substrate, wherein the at least one n-type semiconductor portion has:

a first semiconductor portion into which arsenic is introduced; and a second semiconductor portion into which phosphorus is introduced, and wherein the first semiconductor portion is provided on and above the second semiconductor portion.

2. The semiconductor device according to claim 1, wherein the semiconductor substrate is a silicon substrate, and wherein arsenic is introduced into the at least one n-type semiconductor portion.

3. The semiconductor device according to claim 1, wherein the semiconductor substrate is a silicon substrate, and wherein boron is introduced into the at least one p-type semiconductor portion.

4. The semiconductor device according to claim 1, wherein the element formation region of the semiconductor substrate is provided with:

a power transistor; and a temperature detection diode, wherein the temperature detection diode includes:

the at least one p-type semiconductor portion embedded in the at least one trench; and the at least one n-type semiconductor portion embedded in the at least one trench, wherein the at least one p-type semiconductor portion is electrically connected to a first plug, and wherein the at least one n-type semiconductor portion is electrically connected to a second plug.

5. The semiconductor device according to claim 4, wherein the semiconductor substrate is provided with a p-type layer, wherein the power transistor is a trench gate type IGBT, wherein the at least one trench is provided in the p-type layer and comprises a plurality of trenches, wherein the plurality of trenches include:

a first trench;

a second trench provided next to the first trench, and wherein a plug electrically connected to the p-type layer located between the first trench and the second trench is formed.

6. The semiconductor device according to claim 5, wherein the plug is connected to an emitter potential of the trench gate type IGBT via the p-type layer.

7. The semiconductor device according to claim 1, wherein the at least one p-type semiconductor portion comprises a plurality of p-type semiconductor portions, wherein the at least one n-type semiconductor portion comprises a plurality of n-type semiconductor portions, and wherein the plurality of p-type semiconductor portions and the plurality of n-type semiconductor portions are alternately arranged.

8. The semiconductor device according to claim 7, wherein the plurality of n-type semiconductor portions includes:

a first semiconductor portion connected to the first plug;

a second semiconductor portion connected to the second plug; and a third semiconductor portion located between the first semiconductor portion and the second semiconductor portion.

9. The semiconductor device according to claim 8, wherein the semiconductor substrate is a silicon substrate, wherein arsenic is introduced into the first semiconductor portion, wherein arsenic is introduced into the second semiconductor portion, and wherein phosphorus is introduced into the third semiconductor portion.

10. The semiconductor device according to claim 8, wherein an element formation region of the semiconductor substrate is provided with:

a power transistor having a gate electrode; and a gate protection diode, and wherein the gate protection diode includes:

the plurality of p-type semiconductor portions embedded in the at least one trench; and the plurality of n-type semiconductor portions embedded in the at least one trench.

11. The semiconductor device according to claim 10, wherein the power transistor is a trench gate type IGBT, wherein the first semiconductor portion is electrically connected to a gate electrode of the trench gate type IGBT via the first plug, and wherein the second semiconductor portion is connected to an emitter potential of the trench gate type IGBT via the second plug.

12. The semiconductor device according to claim 11, wherein the at least one trench comprises a plurality of trenches, wherein the plurality of trenches include:

a first trench; and a second trench provided next to the first trench, and wherein a plug connected to the emitter potential of the trench gate type IGBT is formed between the first trench and the second trench.

13. A method of manufacturing a semiconductor device including a trench gate type power transistor, the method comprising:

(a) forming a gate trench in a first region of a semiconductor substrate, and forming a trench in a second region of the semiconductor substrate;

(b) forming a gate insulating film on an inner wall of the gate trench, and forming an insulating film on an inner wall of the trench;

(c) forming a gate electrode in the gate trench;

(d) forming a p-type semiconductor portion in the trench; and (e) forming an n-type semiconductor portion contacting with the p-type semiconductor portion in the trench, wherein the trench gate type power transistor is a trench gate type IGBT, wherein the method comprises:

(f) forming an emitter region of the trench gate type IGBT; and (g) forming a first plug electrically connected to the p-type semiconductor portion, and forming a second plug electrically connected to the n-type semiconductor portion, wherein the (e) and the (f) are performed in the same step, wherein the n-type semiconductor portion includes:

a first semiconductor portion; and a second semiconductor portion, and wherein the (e) has:

(e1) forming the first semiconductor portion in the same step as the (f); and (e2) forming the second semiconductor portion in the same step as the (c).

* * * * *